(12) United States Patent
Dark et al.

(10) Patent No.: US 7,118,998 B1
(45) Date of Patent: Oct. 10, 2006

(54) METHOD OF FORMING A CONDUCTIVE STRUCTURE

(75) Inventors: Charles A. Dark, Arlington, TX (US); William M. Coppock, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/944,152

(22) Filed: Sep. 16, 2004

Related U.S. Application Data

(62) Division of application No. 10/371,431, filed on Feb. 20, 2003, now Pat. No. 6,812,486.

(51) Int. Cl.
  *H01L 21/22* (2006.01)
(52) U.S. Cl. .................................................. 438/542
(58) Field of Classification Search ................ 438/424, 438/427, 433, 434, 514, 542, 545
See application file for complete search history.

(56) References Cited

U.S. PATENT DOCUMENTS

| | | | |
|---|---|---|---|
| 4,808,550 A | 2/1989 | Fukushima | 437/67 |
| 5,200,639 A | 4/1993 | Ishizuka et al. | 257/508 |
| 5,629,226 A * | 5/1997 | Ohtsuki | 438/389 |
| 5,665,630 A | 9/1997 | Ishizuka et al. | 438/620 |
| 6,144,040 A | 11/2000 | Ashton | 257/48 |
| 6,251,734 B1 * | 6/2001 | Grivna et al. | 438/296 |
| 6,287,930 B1 * | 9/2001 | Park | 438/369 |
| 6,365,447 B1 | 4/2002 | Hebert et al. | 438/203 |
| 6,472,709 B1 | 10/2002 | Blanchard | 257/343 |
| 6,784,505 B1 * | 8/2004 | Zeng | 257/397 |
| 6,828,626 B1 * | 12/2004 | Oikawa et al. | 257/330 |
| 2002/0125527 A1 | 9/2002 | Blanchard | 257/328 |
| 2002/0142507 A1 | 10/2002 | Egashira | 438/48 |
| 2003/0042574 A1 | 3/2003 | Schwartzmann | 257/573 |

* cited by examiner

*Primary Examiner*—Scott B. Geyer
(74) *Attorney, Agent, or Firm*—Mark C. Pickering

(57) ABSTRACT

A conductive structure provides a conductive path from a first region in a semiconductor material to a second spaced apart region in the semiconductor material by forming a plurality of trenches between the first and second regions, implanting a dopant into the bottom surfaces of the trenches, and then annealing the wafer to cause the dopant at the bottom surfaces to diffuse and form a continuous conductive path.

15 Claims, 20 Drawing Sheets

METHOD OF FORMING A CONDUCTIVE STRUCTURE

RELATED APPLICATION

This is a divisional application of application Ser. No. 10/371,431 filed on Feb. 20, 2003 now U.S. Pat. No. 6,812,486.

The present invention is related to application Ser. No. 10/371,479 for "Conductive Structure in a Semiconductor Material" by William M. Coppock and Charles A. Dark filed on Feb. 20, 2003.

DETAILED DESCRIPTION OF THE INVENTION

Figure 1:
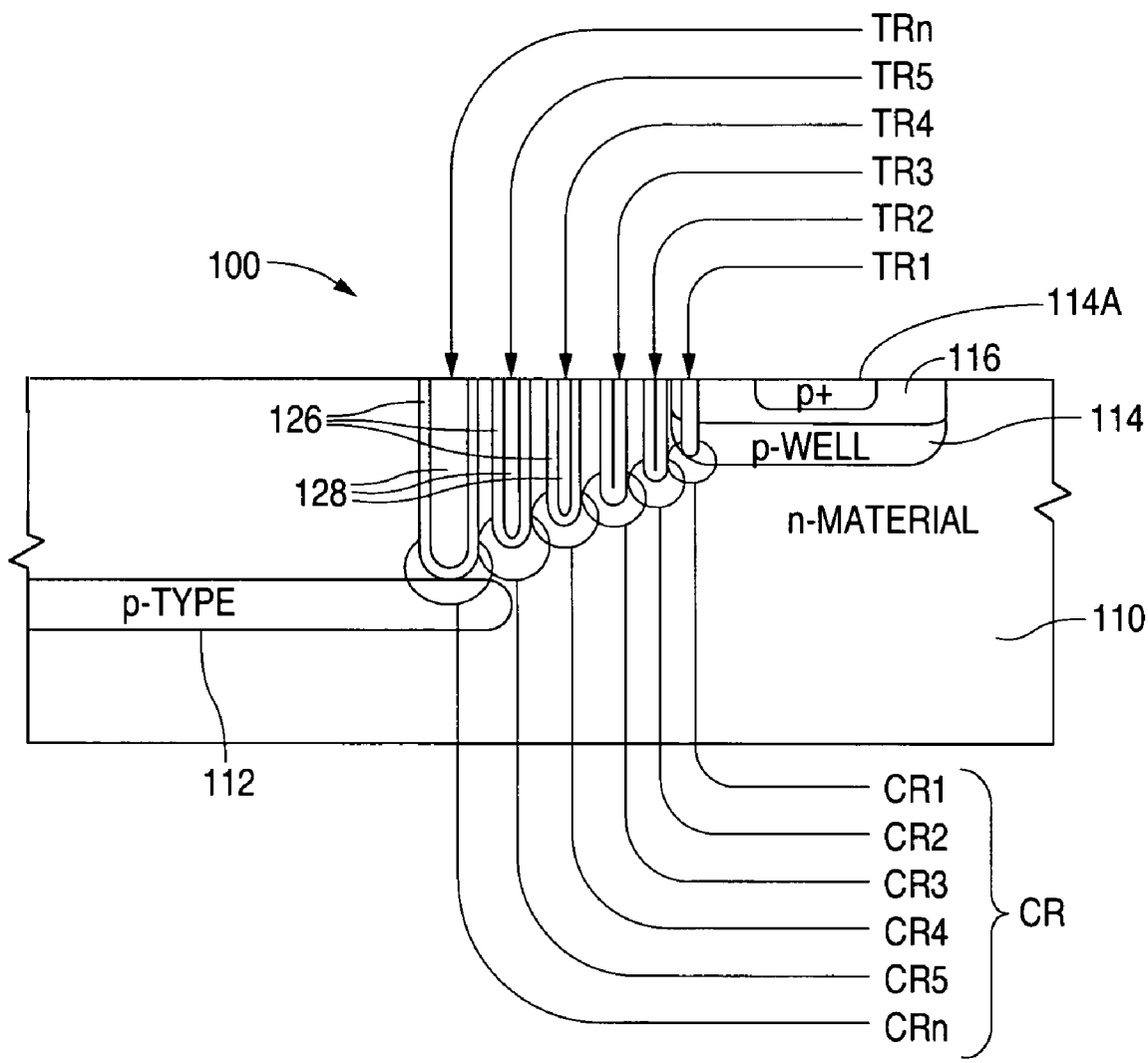
FIG. 1 is a cross-sectional view illustrating an example of a conductive structure 100 in accordance with the present invention.

FIG. 1 shows a cross-sectional view that illustrates an example of a conductive structure 100 in accordance with the present invention. As shown in FIG. 1, conductive structure 100, which is formed in a semiconductor material 110, includes first and second p-type conductive regions 112 and 114, respectively, that are formed in material 110. Examples of semiconductor material 110 include an n-type substrate, an n-type epitaxial layer, and an epitaxial layer on an n-type substrate. Conductive regions 112 and 114 are vertically spaced apart, and can be horizontally spaced apart as shown.

In the FIG. 1 example, first conductive region 112 is formed as a p-type subsurface region in an n-type portion of semiconductor material 110, while second conductive region 114 is formed as a p-type well that contacts the top surface of semiconductor material 110. First conductive region 112 can be implemented as, for example, a buried region or a channel stop region.

As further shown in FIG. 1, structure 100 can also include a contact region 114A that is formed in second conductive region 114. Contact region 114A has a higher dopant concentration than region 114. For example, region 114 can have a p dopant concentration, while contact region 114A can have a p+ dopant concentration.

In addition, structure 100 can optionally include a p-body region 116 that is formed in well 114. Region 116 has a slightly higher dopant concentration than well 114. Further, p-body region 116 is approximately the same size and shape in plan view as well 114.

As further shown in FIG. 1, structure 100 also includes a series of spaced apart trenches TR1–TRn that are formed in semiconductor material 110 such that the bottom surfaces of the trenches TR1–TRn are formed between first and second conductive regions 112 and 114. In addition, the widths and depths of the trenches TR1–TRn increase as the bottom surfaces of the trenches move from region 114 to region 112.

In the example shown in FIG. 1, six trenches are utilized to form an incrementally increasing depth that approaches conductive region 112. Alternately, a larger or smaller number of trenches can be utilized. In addition, the trenches TR1–TRn are also lined with an isolation material 126, such as an oxide, and are filled with a filler material 128, such as polysilicon or oxide.

Conductive structure 100 additionally includes a p-type conductor CR that electrically connects together first and second regions 112 and 114. Conductor CR, in turn, includes a series of adjoining p-type conductive regions CR1–CRn that are formed in semiconductor material 110 below and in contact with the bottom surfaces of the trenches TR1–TRn. In the FIG. 1 example, six conductive regions are utilized, with the first conductive region CR1 contacting conductive region 114, and the last conductive region CRn contacting conductive region 112.

In operation, in the FIG. 1 example, when a first potential is present on conductive region 112 and a higher second potential is present on contact region 114A, a current flows from region 114A to region 114, and then to region 112 via conductor CR.

One advantage of the present invention is that by forming trenches TR1–TRn with increasing depths, the present invention allows conductive regions that lie at different depths in the semiconductor material to be connected together. For example, trenches TR1–TRn can be used in lieu of a deep vertical conductor, such as a sinker.

Additional trenches can also be used to connect first conductive region 112 with another region that is lower than region 112. Further, although region 112 has been described as having a p-type conductivity in an n-type material, the present invention applies when the conductivity types of the materials are reversed.

Figure 2A:
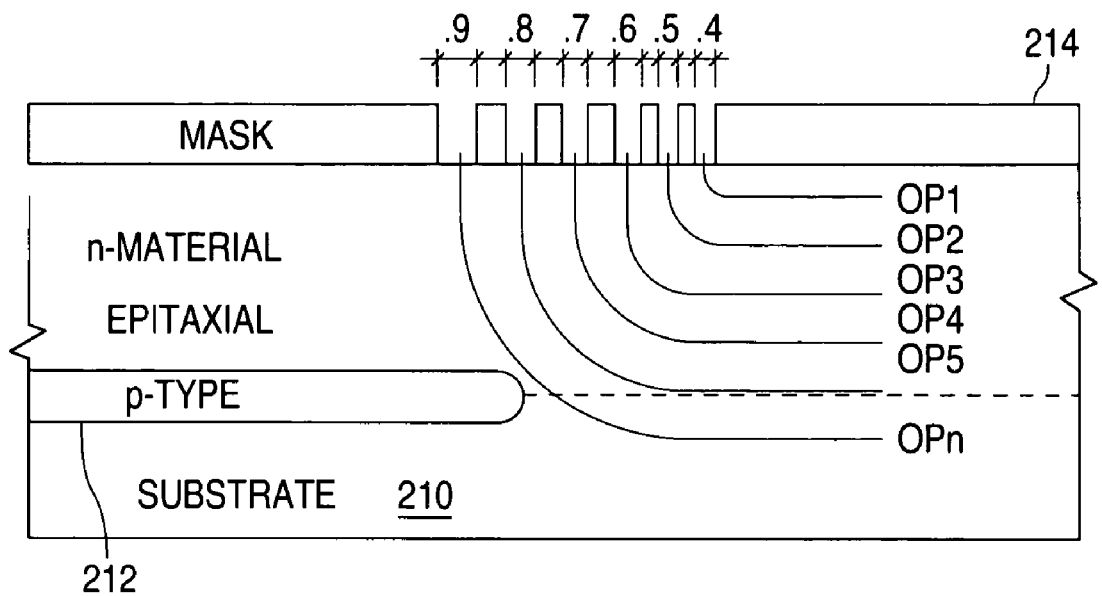
FIGS. 2A–2F are a series of cross-sectional views illustrating a method of forming a conductive structure in accordance with the present invention.

FIGS. 2A–2F show cross-sectional views that illustrate an example of a method of forming a conductive structure in accordance with the present invention. As shown in FIG. 2A, the method uses a conventionally formed semiconductor material 210, such as an epitaxial layer on an n-type substrate, that has a p-type subsurface conductive region 212, such as a buried layer, formed in material 210 between the epitaxial layer and the n-type substrate.

As further shown in FIG. 2A, the method begins by forming a mask 214 on semiconductor material 210. The mask is patterned to have a series of spaced apart openings OP1–OPn. In the FIG. 2A example, six openings are utilized. (A larger or smaller number of openings can alternately be utilized).

The openings in the mask are formed to have different widths. In one embodiment, the first opening OP1 has the smallest width, the last opening OPn has the largest width, while the remaining widths of the openings incrementally increase from the smallest to the largest. For example, openings OP1–OPn can be formed to have widths of 0.4 µm, 0.5 µm, 0.6 µm, 0.7 µm, 0.8 µm, and 0.9 µm, respectively.

Figure 2B:
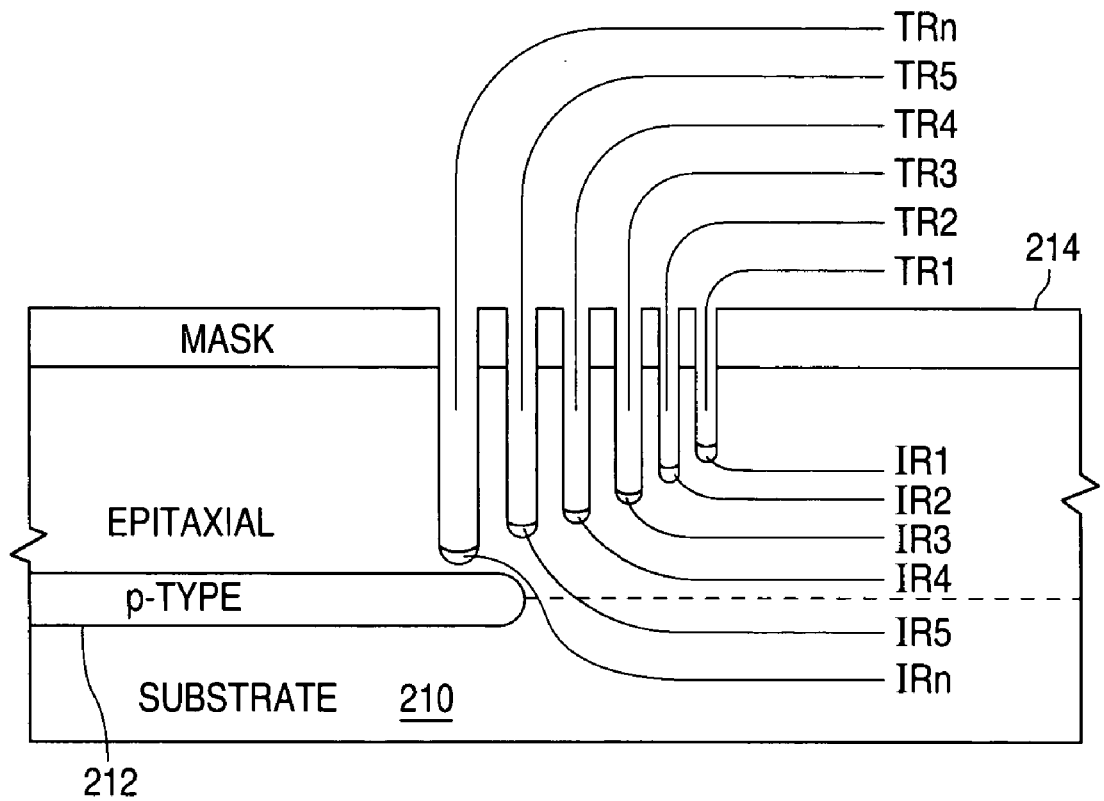

Next, as shown in FIG. 2B, semiconductor material 210 is anisotropically etched to remove the material not protected by mask 214, forming a series of trenches TR1–TRn. Since the widths of the trenches TR1–TRn are different, the depths of the trenches TR1–TRn are different due to aspect ratio dependent etching. In this case, the depth of each trench is determined by the width of the mask opening; a wider opening yielding a deeper trench.

In the FIG. 2B example, six trenches are formed, each having opposing sidewalls and a bottom surface. In addition, the trenches are arranged so that the bottom surface of trench TRn, the deepest trench, is located above conductive region 212. (Although six trenches are shown in the example, the number and depth of trenches can alternately be varied).

As further shown in FIG. 2B, after the trenches TR1–TRn have been formed, the bottom surfaces of the trenches TR1–TRn are then implanted with a p-type dopant, such as boron, to form a series of implanted regions IR1–IRn that lie below the bottom surfaces of the trenches TR1–TRn. In the FIG. 2B example, six implanted regions are formed under the six trenches TR1–TRn. Following this, mask 214 is removed.

Figure 2C:
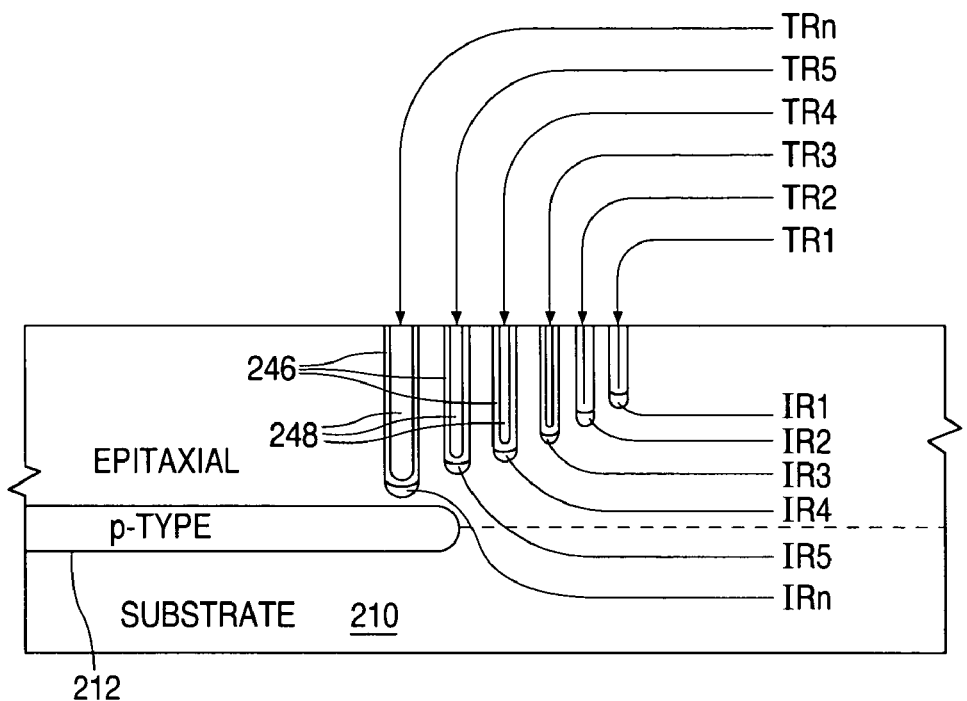

Turning to FIG. 2C, after mask 214 has been removed, a layer of isolation material 246, such as thermally grown oxide, is formed on semiconductor material 210 and trenches TR1–TRn to line trenches TR1–TRn. After trenches TR1–TRn have been lined, a layer of filler material 248, such as oxide or polysilicon, is formed on material 246 to fill trenches TR1–TRn. Once filled, the top surface of semiconductor material 210 is planarized to remove filler material 248 and isolation material 246 from the top surface of semiconductor material 210.

Figure 2D:
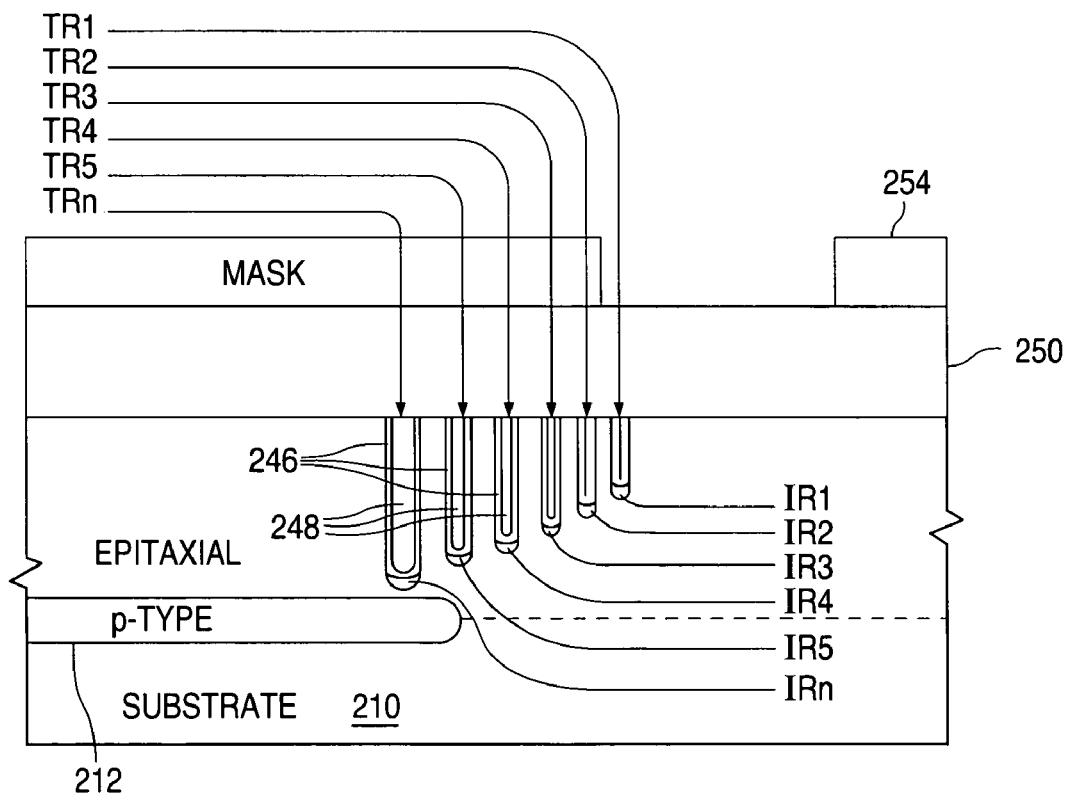

After this step, as shown in FIG. 2D, an insulating layer 250, such as sacrificial oxide, is formed on semiconductor material 210 and the top surfaces of the isolation material 246 and fill material 248 in trenches TR1–TRn. Following this, a mask 254 is formed and patterned on layer 250.

Figure 2E:
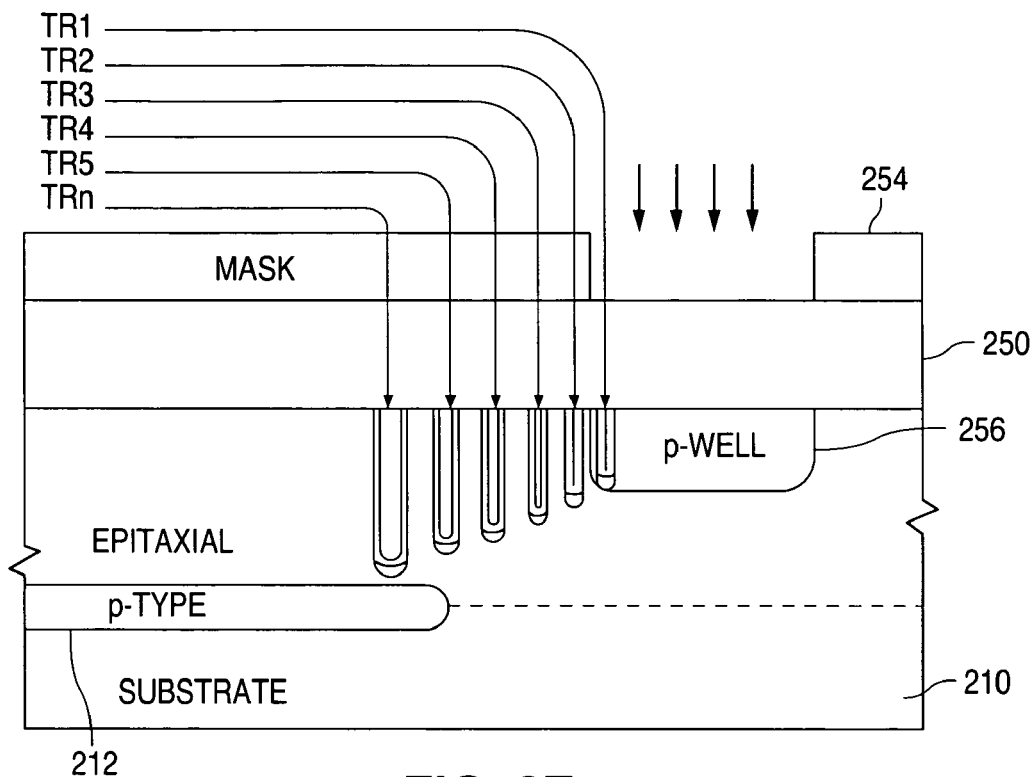

Next, as shown in FIG. 2E, semiconductor material 210 is implanted with a p-type dopant to form a well 256. Well 256 can be formed at the same time that the p-wells are formed on other portions of the wafer. Following this, mask 254 and sacrificial layer 250 are then removed.

Figure 2F:
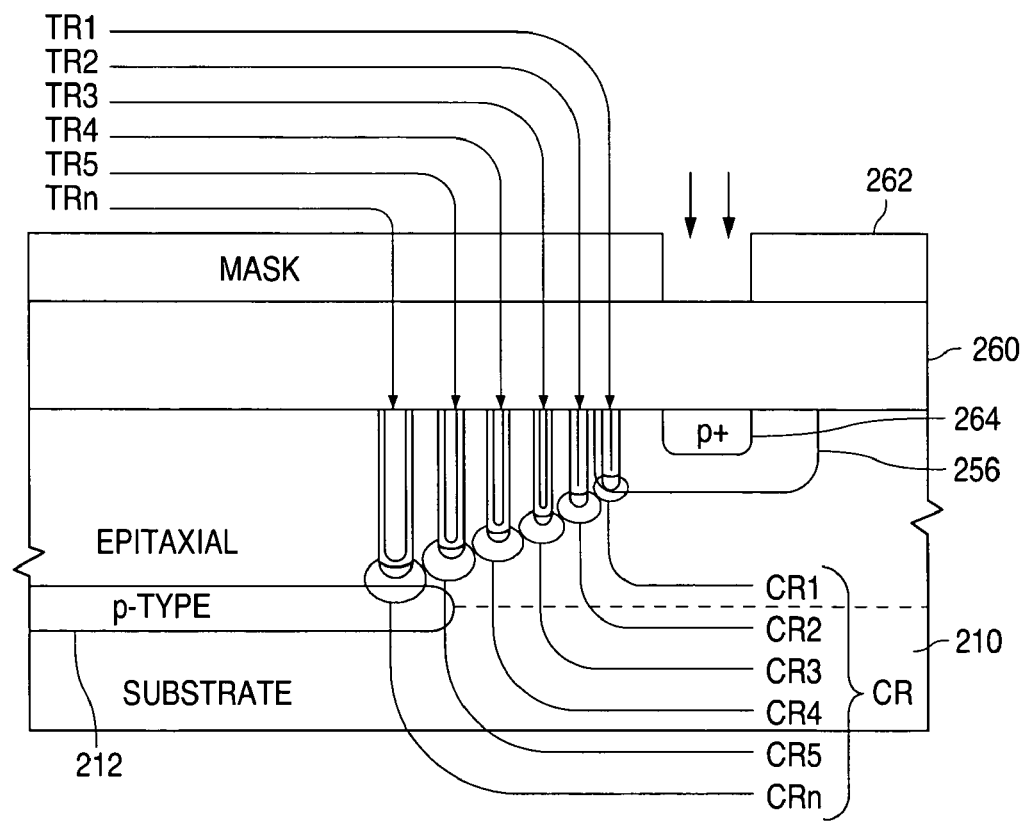

After this, as shown in FIG. 2F, an insulating layer 260, such as oxide, is formed on semiconductor material 210 and the top surfaces of the isolation material 246 and fill material 248 in trenches TR1–TRn. Following this, a mask 262 is formed and patterned on layer 260. (A number of intermediate steps typically take place on other portions of the wafer to form MOS and/or bipolar transistors prior to the formation of mask 262. Mask 262 is used to protect the n-type regions and expose the p-type contact regions of the wafer).

Next, semiconductor material 210 is implanted with a p-type dopant to form a p+ contact region 264 in well 256. Region 264 can be formed at the same time that the p+ regions are formed on other portions of the wafer. Following this, mask 262 is removed.

Following the implant, the wafer is annealed to drive in the dopants and repair lattice damage caused by the implants. The annealing process causes the dopants in implanted regions IR1–IRn below the bottom surfaces of trenches TR1–TRn to diffuse out to the surrounding semiconductor material to form conductive regions CR1–CRn.

Conductive regions CR1–CRn contact adjacent regions to form a conductor CR that electrically connects first conductive region 212 with p-well 256. After the wafer has been annealed, the method continues with conventional back end processing steps.

Figure 3A:
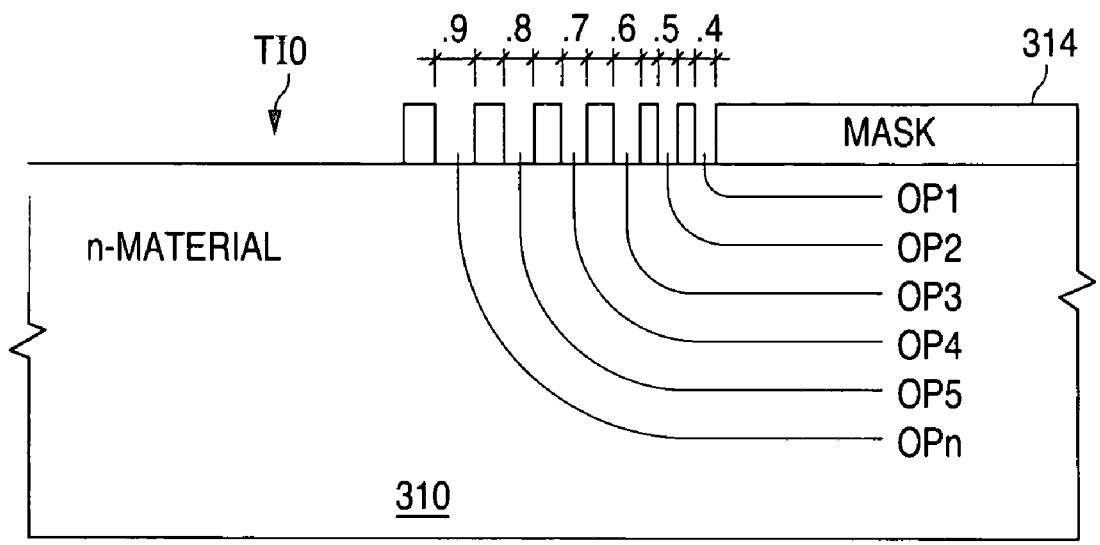
FIGS. 3A–3F are a series of cross-sectional views illustrating a method of forming a conductive structure in accordance with the present invention.

FIGS. 3A–3F show cross-sectional views that illustrate an example of a method of forming a conductive structure in accordance with the present invention. As shown in FIG. 3A, the method uses a conventionally formed n-type semiconductor material 310, such as a substrate, an epitaxial layer, or an epitaxial layer on a substrate.

As further shown in FIG. 3A, the method begins by forming a mask 314 on semiconductor material 310. The mask is patterned to have a trench isolation opening TIO, and a series of spaced apart conductor openings OP1–OPn. In the FIG. 3A example, six conductor openings are utilized. (A larger or smaller number of openings can alternately be utilized).

The conductor openings in the mask are formed to have different widths. In one embodiment, the first opening OP1 has the smallest width, the last opening OPn has the largest width, while the remaining widths of the openings incrementally increase from the smallest to the largest. For example, openings OP1–OPn can be formed to have widths of 0.4 µm, 0.5 µm, 0.6 µm, 0.7 µm, 0.8 µm, and 0.9 µm, respectively. In addition, the last opening OPn lies adjacent to the trench isolation opening TIO.

Figure 3B:
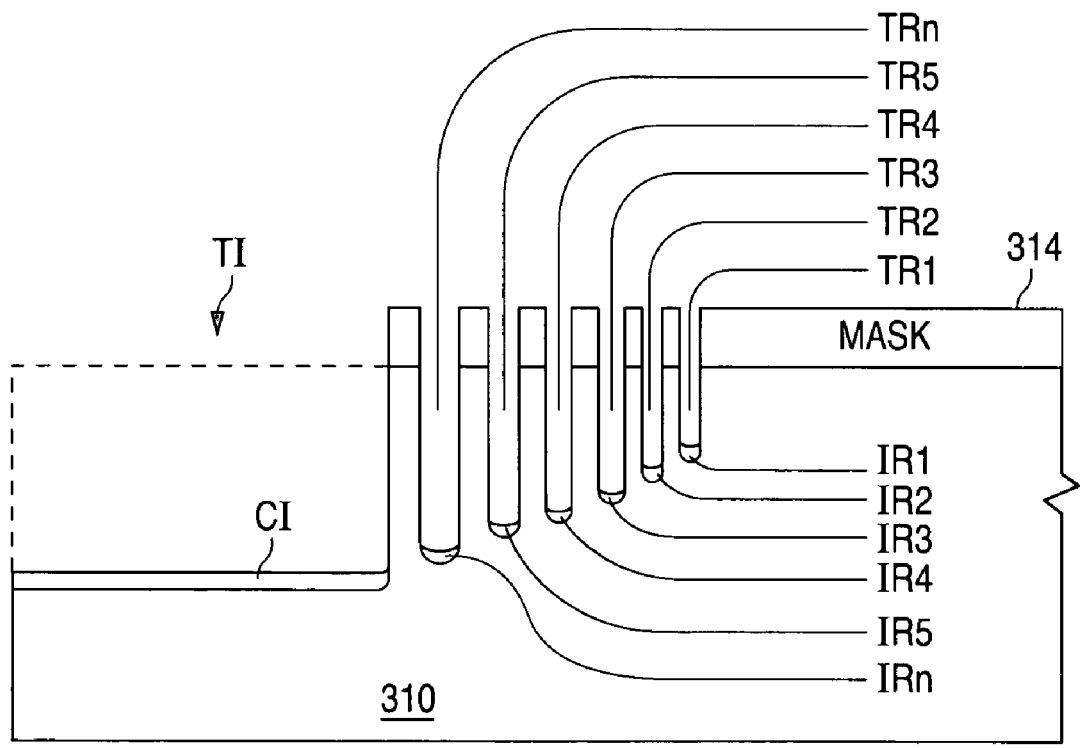

Next, as shown in FIG. 3B, semiconductor material 310 is anisotropically etched to remove the material not protected by mask 314, forming an isolation trench TI and a series of conductor trenches TR1–TRn. Since the widths of the conductor trenches TR1–TRn are different, the depths of the trenches TR1–TRn are different due to aspect ratio dependent etching. In this case, the depth of each trench is determined by the width of the mask opening; a wider opening yielding a deeper trench.

In the FIG. 3B example, six conductor trenches are formed, each having opposing sidewalls and a bottom surface. In addition, the trenches are arranged so that the bottom surface of trench TRn, the deepest trench, is located adjacent to the bottom surface of isolation trench TI. (Although six conductor trenches are shown in the example, the number and depth of trenches can alternately be varied.)

As further shown in FIG. 3B, after the trenches have been formed, the bottom surfaces of the isolation trench TI and the trenches TR1–TRn are then implanted with a p-type dopant, such as boron, to form a channel stop implant CI that lies below the bottom surface of isolation trench TI, and a series of implanted regions IR1–IRn that lie below the bottom surfaces of the trenches TR1–TRn. In the FIG. 3B example, six implanted regions are formed under the six trenches TR1–TRn. Following this, mask 314 is removed.

Figure 3C:
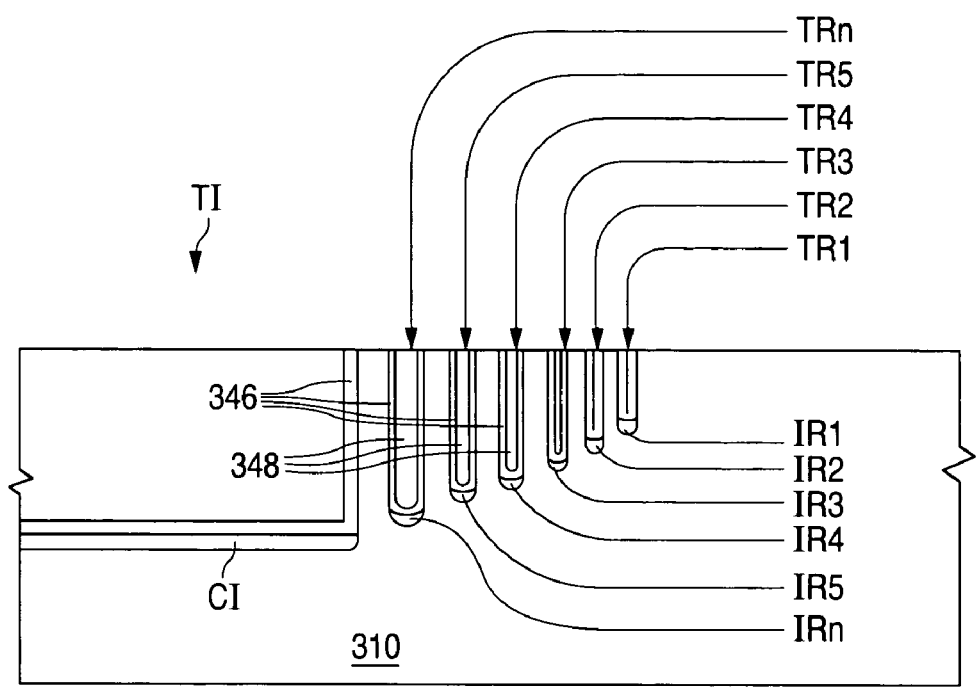

Turning to FIG. 3C, after mask 314 has been removed, a layer of isolation material 346, such as thermally grown oxide, is formed on semiconductor material 310, isolation trench TI, and trenches TR1–TRn to line trenches TI and TR1–TRn. After the trenches have been lined, a layer of filler material 348, such as oxide or polysilicon, is formed on material 346 to fill trenches TI and TR1–TRn. Once filled, the top surface of semiconductor material 310 is planarized to remove filler material 348 and isolation material 346 from the top surface of semiconductor material 310.

Figure 3D:
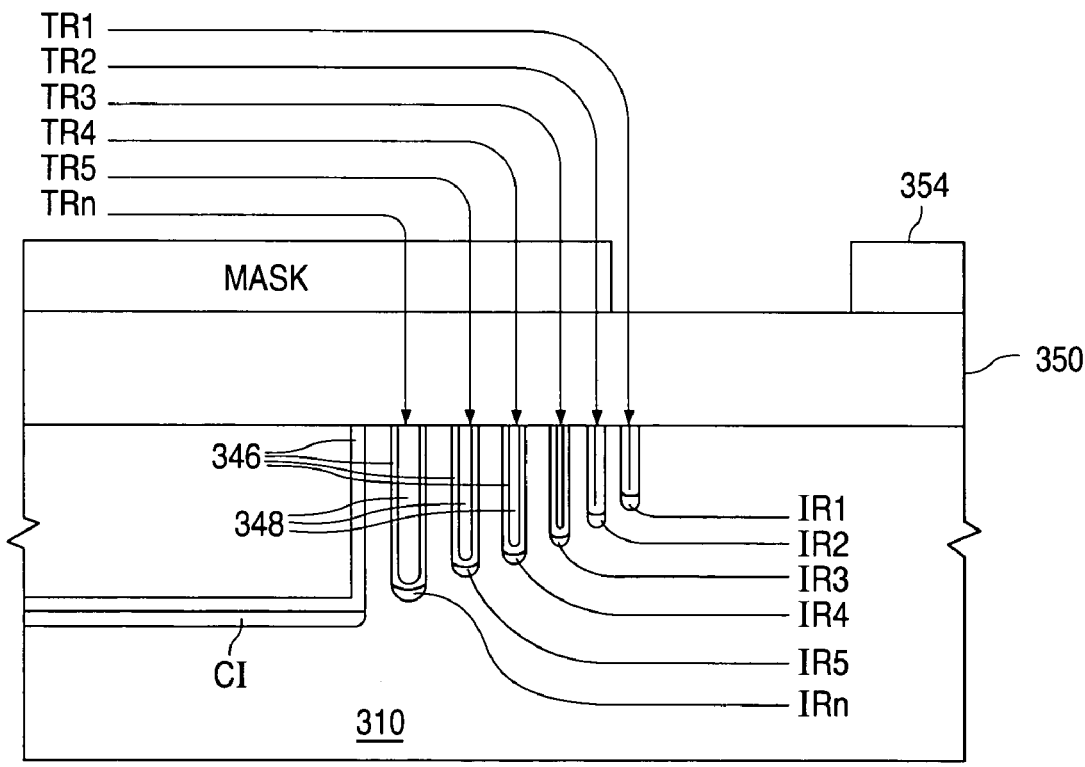

After this step, as shown in FIG. 3D, an insulating layer 350, such as sacrificial oxide, is formed on semiconductor material 310 and the top surfaces of the isolation material 346 and fill material 348 in trenches TI and TR1–TRn. Following this, a mask 354 is formed and patterned on layer 350.

Figure 3E:
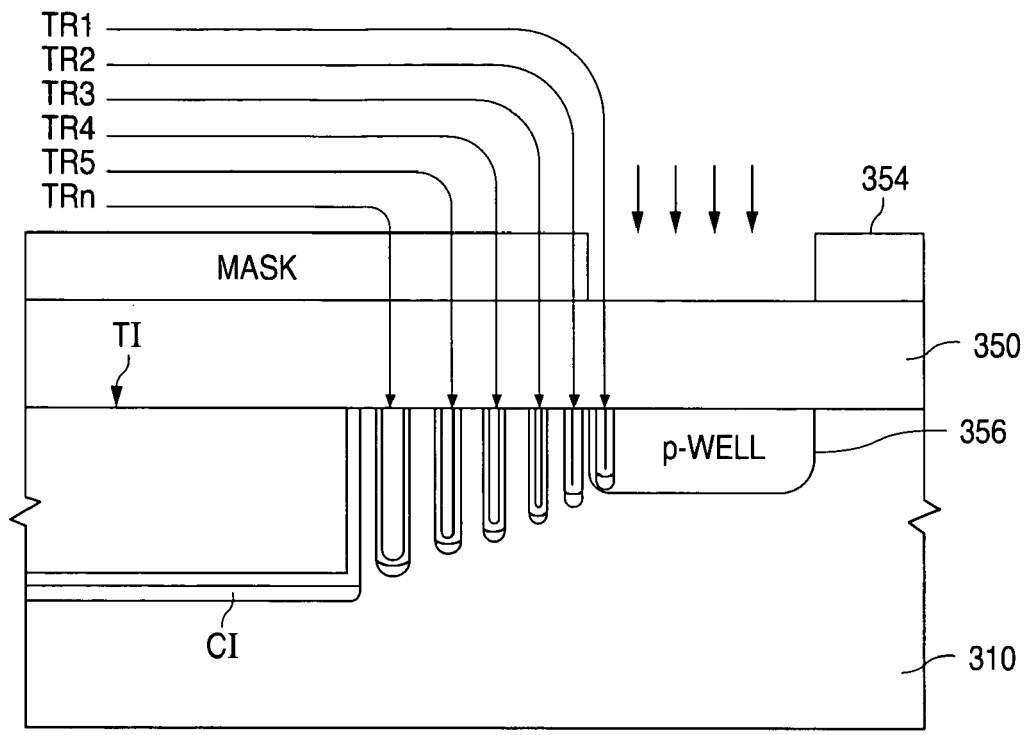

Next, as shown in FIG. 3E, semiconductor material 310 is implanted with a p-type dopant to form a well 356. Well 356 can be formed at the same time that the p-wells are formed on other portions of the wafer. Following this, mask 354 and sacrificial layer 350 are then removed.

Figure 3F:
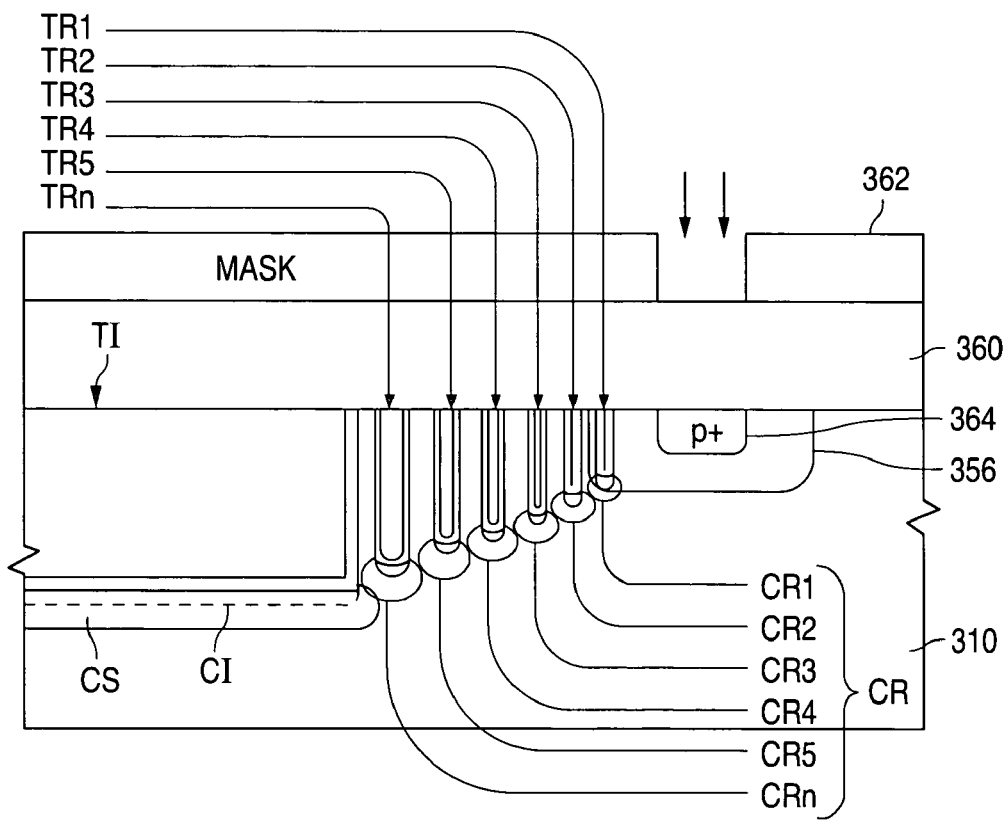

After this, as shown in FIG. 3F, an insulating layer 360, such as oxide, is formed on semiconductor material 310 and the top surfaces of the isolation material 346 and fill material 348 in trenches TI and TR1–TRn. Following this, a mask 362 is formed and patterned on layer 360. (A number of intermediate steps typically take place on other portions of the wafer to form MOS and/or bipolar transistors prior to the formation of mask 362. Mask 362 is used to protect the n-type regions and expose the p-type contact regions of the wafer).

Next, semiconductor material 310 is implanted with a p-type dopant to form a p+ contact region 364 in well 356. Region 364 can be formed at the same time that the p+ regions are formed on other portions of the wafer. Following this, mask 362 is removed.

Following the implant, the wafer is annealed to drive in the dopants and repair lattice damage caused by the implants. The annealing process causes the dopants in the channel stop implant CI below the bottom surface of isolation trench TI to diffuse out and form a channel stop region CS. In addition, the annealing step also causes the dopants in the implanted regions IR1–IRn below the bottom surfaces of trenches TR1–TRn to diffuse out to the surrounding semiconductor material to form conductive regions CR1–CRn.

Conductive regions CR1–CRn contact adjacent regions to form a conductor CR that electrically connects the channel stop region CS with p-well 356. After the wafer has been annealed, the method continues with conventional back end processing steps.

Figure 4:
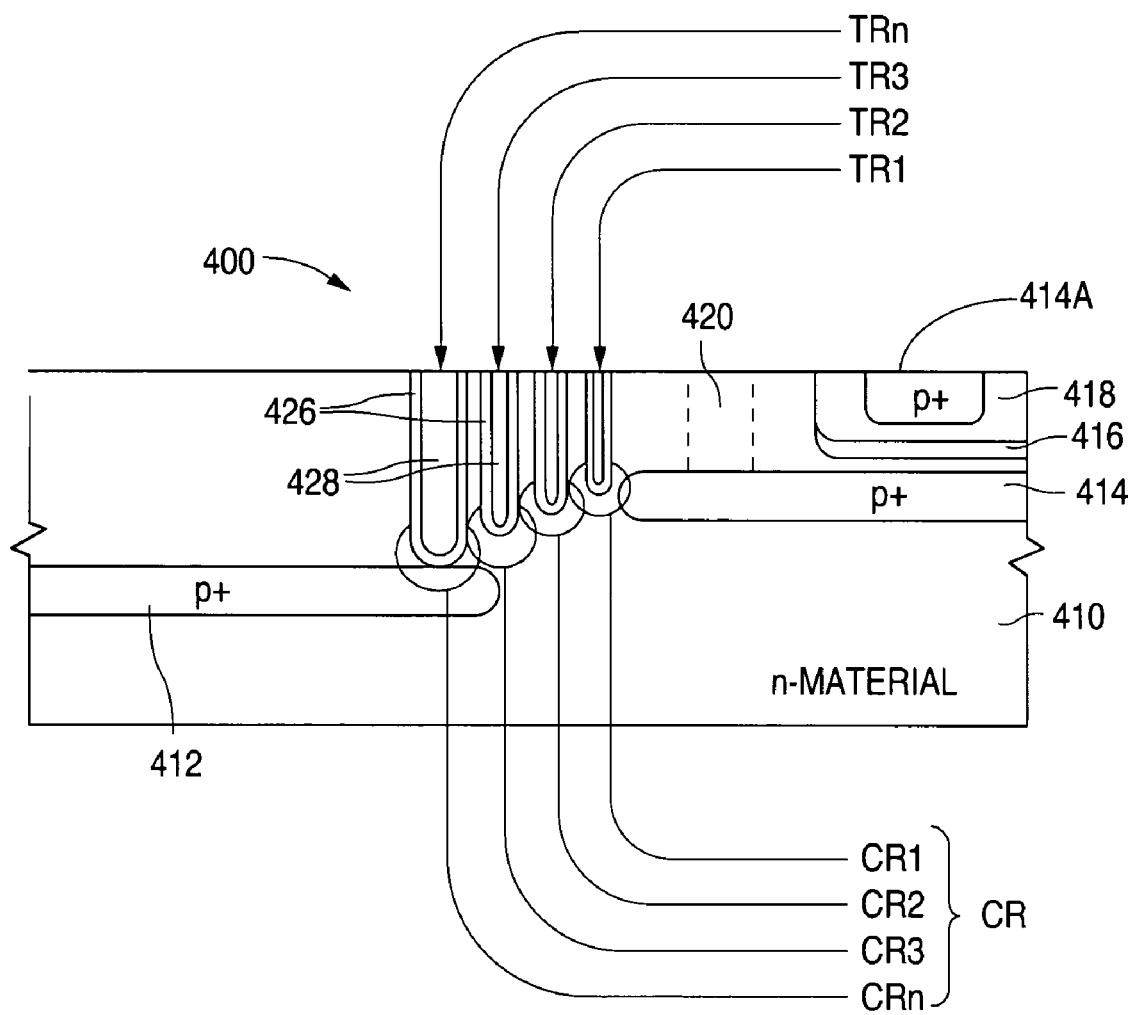
FIG. 4 is a cross-sectional view illustrating an example of a conductive structure 400 in accordance with the present invention.

FIG. 4 shows a cross-sectional view that illustrates an example of a conductive structure 400 in accordance with the present invention. As shown in FIG. 4, conductive structure 400, which is formed in a semiconductor material 410, such as an epitaxial layer formed on an n-type substrate, includes first and second p-type conductive regions 412 and 414, respectively, that are formed in material 410. Conductive regions 412 and 414 are vertically spaced apart, and can be horizontally spaced apart as shown.

In the FIG. 4 example, first and second conductive regions 412 and 414 are both formed as p-type subsurface regions in an n-type portion of semiconductor material 410. First conductive region 412 can be implemented as, for example, a channel stop region, while second conductive region 414 can be implemented as, for example, a buried region.

As further shown in FIG. 4, structure 400 also includes a contact region 414A that is formed in semiconductor material 410. Contact region 414A is vertically spaced apart from second conductive region 414, and can have approximately the same dopant concentration as region 414. For example, regions 414 and 414A can both have a p+ dopant concentration.

Further, structure 400 can optionally include a p-well 416 that is formed in semiconductor material 410 such that region 414A is formed in well 416. In addition, structure 400 can optionally include a p-body region 418 that is formed in well 416. Region 418 has a slightly higher dopant concentration than well 416. Further, p-body region 418 is approximately the same size and shape in plan view as well 416.

Second conductive region 414 and well 416 are spaced apart. However, structure 400 can further optionally include a sinker region 420 that extends upwards from region 414 to well 416, body 418, region 414A, or the top surface of material 410. Sinker region 420 provides a lower resistance path.

As further shown in FIG. 4, conductor 400 also includes a series of spaced apart trenches TR1–TRn that are formed in semiconductor material 410 such that the bottom surfaces of trenches TR1–TRn are formed between first and second conductive regions 412 and 414. In addition, the widths and depths of the trenches TR1–TRn increase as the bottom surfaces of the trenches move from region 414 to region 412.

In the example shown in FIG. 4, four trenches are utilized to form an incrementally increasing depth that approaches conductive region 412. Alternately, a larger or smaller number of trenches can be utilized. In addition, the trenches TR1–TRn are also lined with an isolation material 426, such as an oxide, and are filled with a filler material 428, such as polysilicon or oxide.

Conductive structure 400 additionally includes a conductor CR that electrically connects together first and second regions 412 and 414. Conductor CR, in turn, includes a series of adjoining conductive regions CR1–CRn that are formed in semiconductor material 410 below and in contact with the bottom surfaces of the trenches TR1–TRn. In the FIG. 4 example, four conductive regions are utilized, with the first conductive region CR1 contacting conductive region 414, and the last conductive region CRn contacting conductive region 412.

In operation, when a first potential is present on conductive region 412 and a higher second potential is present on contact region 414A, a current flows from region 414A to region 414 through material 410 (and well 416, body 418, and sinker 420 if present), and then to region 412 via conductor CR.

Additional trenches can also be used to connect first conductive region 412 with another region that is lower than region 412. Further, although region 412 has been described as having a p-type conductivity in an n-type material, the present invention applies when the conductivity types of the materials are reversed.

Figure 5A:
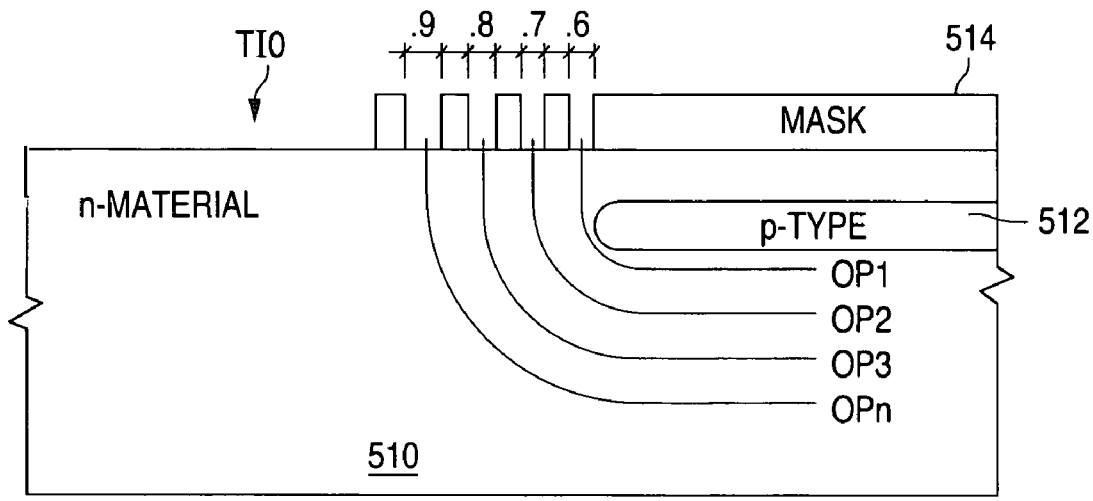
FIGS. 5A–5F are cross-sectional views illustrating an example of a method of forming a conductive structure in accordance with the present invention.

FIGS. 5A–5F show cross-sectional views that illustrate an example of a method of forming a conductive structure in accordance with the present invention. As shown in FIG. 5A, the method uses a conventionally formed semiconductor material 510, such as an epitaxial layer on an n-type substrate, that has a p-type subsurface conductive region 512, such as a buried layer, formed in material 510 between the epitaxial layer and the substrate.

As further shown in FIG. 5A, the method begins by forming a mask 514 on semiconductor material 510. The mask is patterned to have a trench isolation opening TIO, and a series of spaced apart conductor openings OP1–OPn. In the FIG. 5A example, four conductor openings are utilized. (A larger or smaller number of openings can alternately be utilized).

The conductor openings in the mask are formed to have different widths. In one embodiment, the first opening OP1 has the smallest width, the last opening OPn has the largest width, while the remaining widths of the openings incrementally increase from the smallest to the largest. For example, openings OP1–OPn can be formed to have widths of 0.6 µm, 0.7 µm, 0.8 µm, and 0.9 µm, respectively. In addition, the last opening OPn lies adjacent to the trench isolation opening TIO.

Figure 5B:
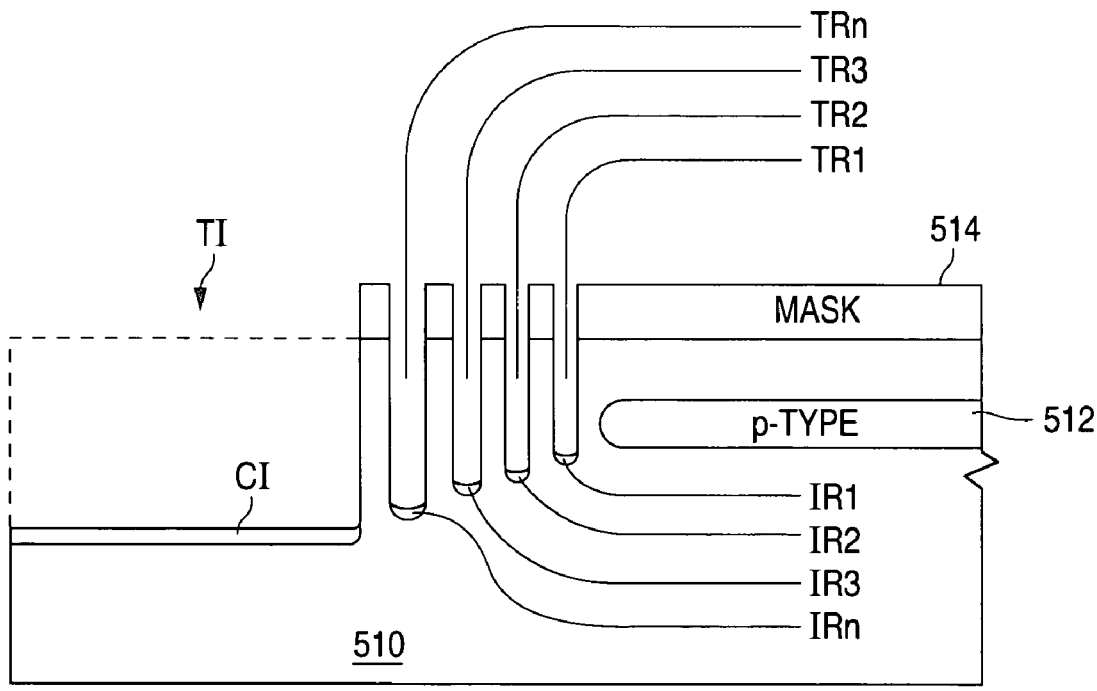

Next, as shown in FIG. 5B, semiconductor material 510 is anisotropically etched to remove the material not protected by mask 514, forming an isolation trench TI and a series of conductor trenches TR1–TRn. Since the widths of the conductor trenches TR1–TRn are different, the depths of the trenches TR1–TRn are different due to aspect ratio dependent etching. In this case, the depth of each trench is determined by the width of the mask opening; a wider opening yielding a deeper trench.

In the FIG. 5B example, four conductor trenches are formed, each having opposing sidewalls and a bottom surface. In addition, the trenches are arranged so that the bottom surface of trench TRn, the deepest trench, is located adjacent to the bottom surface of isolation trench TI. (Although four conductor trenches are shown in the example, the number and depth of trenches can alternately be varied.)

As further shown in FIG. 5B, after the trenches have been formed, the bottom surfaces of the isolation trench TI and the trenches TR1–TRn are then implanted with a p-type dopant, such as boron, to form a channel stop implant CI that lies below the bottom surface of isolation trench TI, and a series of implanted regions IR1–IRn that lie below the bottom surfaces of the trenches TR1–TRn. In the FIG. 5B example, four implanted regions are formed under the four trenches TR1–TRn. Following this, mask 514 is removed.

Figure 5C:
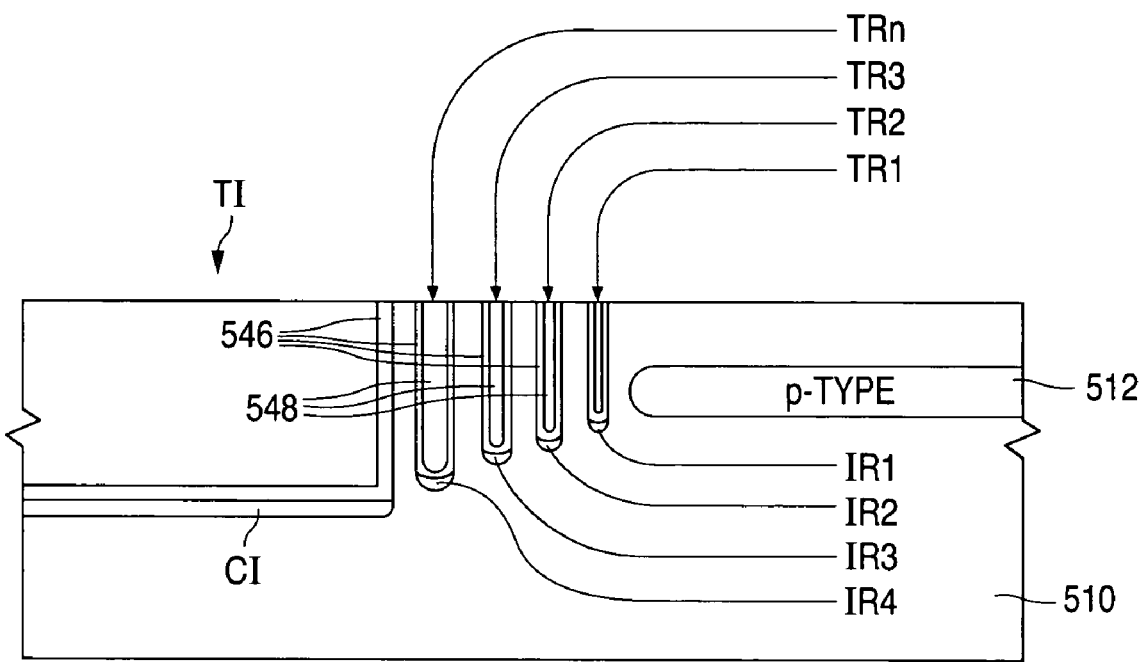

Turning to FIG. 5C, after mask 514 has been removed, a layer of isolation material 546, such as thermally grown oxide, is formed on semiconductor material 510, isolation trench TI, and trenches TR1–TRn to line trenches TI and TR1–TRn. After the trenches have been lined, a layer of filler material 548, such as oxide or polysilicon, is formed on material 546 to fill trenches TI and TR1–TRn. Once filled, the top surface of semiconductor material 510 is planarized to remove filler material 548 and isolation material 546 from the top surface of semiconductor material 510.

Figure 5D:
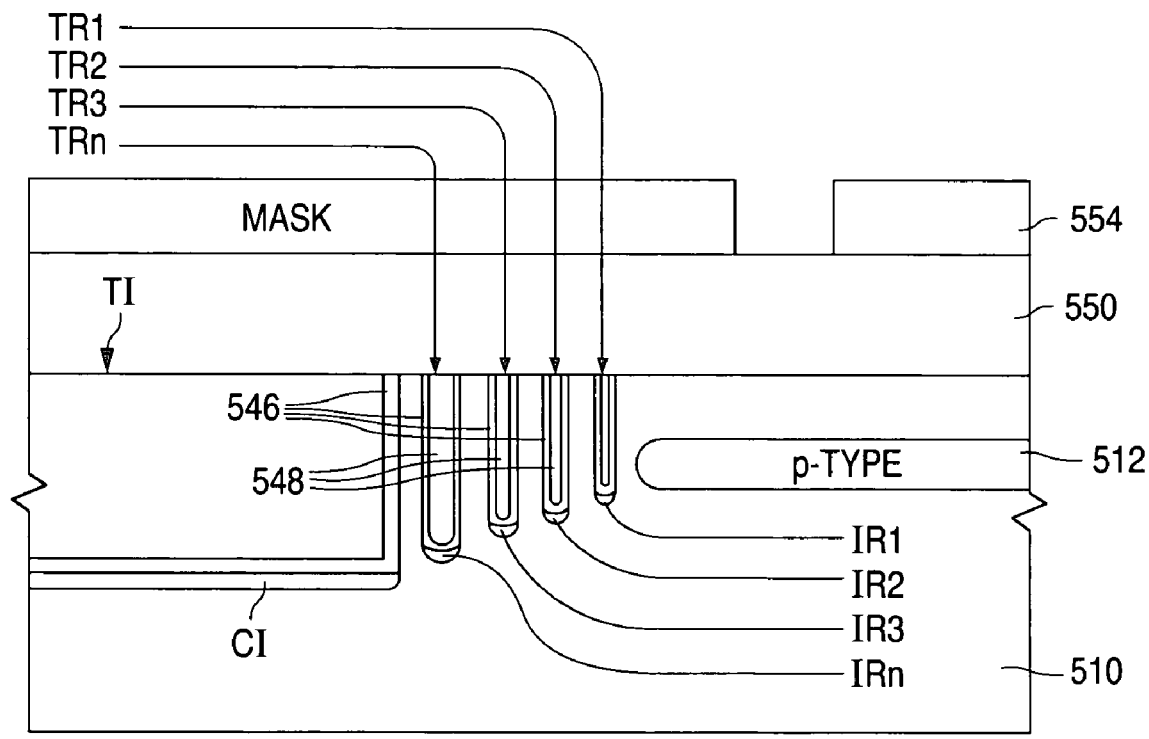

After this step, as shown in FIG. 5D, an insulating layer 550, such as sacrificial oxide, is formed on semiconductor material 510 and the top surfaces of the isolation material 546 and fill material 548 in trenches TI and TR1–TRn. Following this, a mask 554 is formed and patterned on layer 550.

Figure 5E:
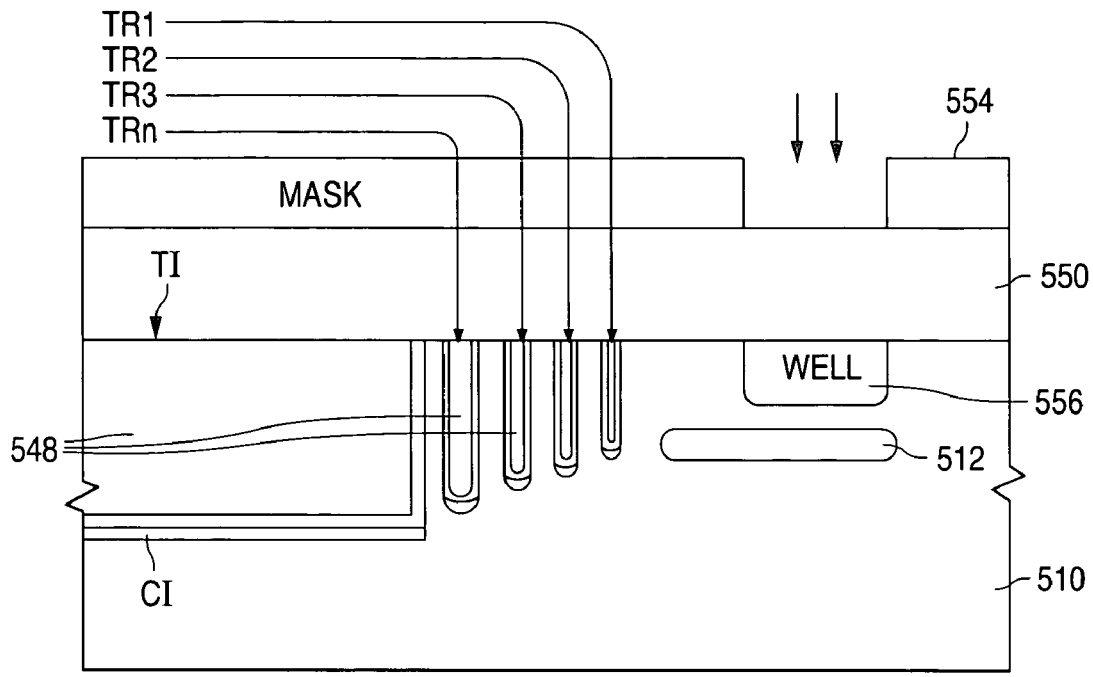

Next, as shown in FIG. 5E, semiconductor material 510 is implanted with a p-type dopant to form a well 556. Well 556 can be formed at the same time that the p-wells are formed on other portions of the wafer. Following this, mask 554 and sacrificial layer 550 are then removed.

Figure 5F:
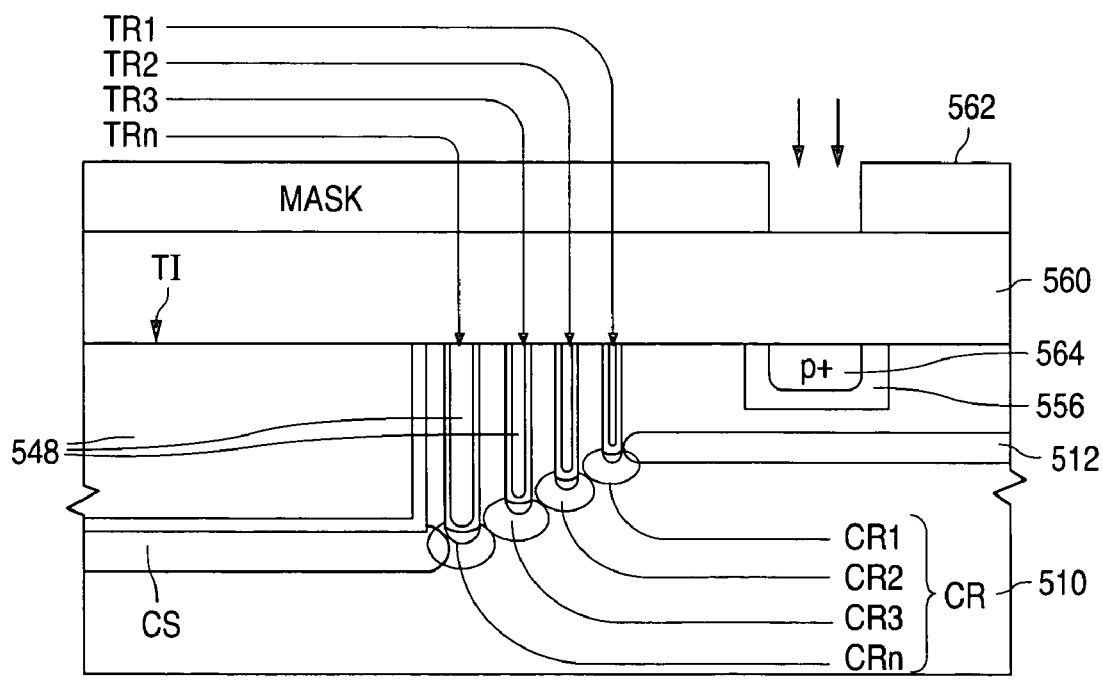

After this, as shown in FIG. 5F, an insulating layer 560, such as oxide, is formed on semiconductor material 510 and the top surfaces of the isolation material 546 and fill material 548 in trenches TI and TR1–TRn. Following this, a mask 562 is formed and patterned on layer 560. (A number of intermediate steps typically take place on other portions of the wafer to form MOS and/or bipolar transistors prior to the formation of mask 562. Mask 562 is used to protect the n-type regions and expose the p-type contact regions of the wafer).

Next, semiconductor material 510 is implanted with a p-type dopant to form a p+ contact region 564 in well 556. Region 564 can be formed at the same time that the p+ regions are formed on other portions of the wafer. Following this, mask 562 is removed.

Following the implant, the wafer is annealed to drive in the dopants and repair lattice damage caused by the implants. The annealing process causes the dopants in the channel stop implant CI below the bottom surface of isolation trench TI to diffuse out and form a channel stop region CS. In addition, the annealing step also causes the dopants in the implanted regions IR1–IRn below the bottom surfaces of trenches TR1–TRn to diffuse out to the surrounding semiconductor material to form conductive regions CR1–CRn.

Conductive regions CR1–CRn contact adjacent regions to form a conductor CR that electrically connects the channel stop region CS with conductive region 512. After the wafer has been annealed, the method continues with conventional back end processing steps.

Figure 6A:
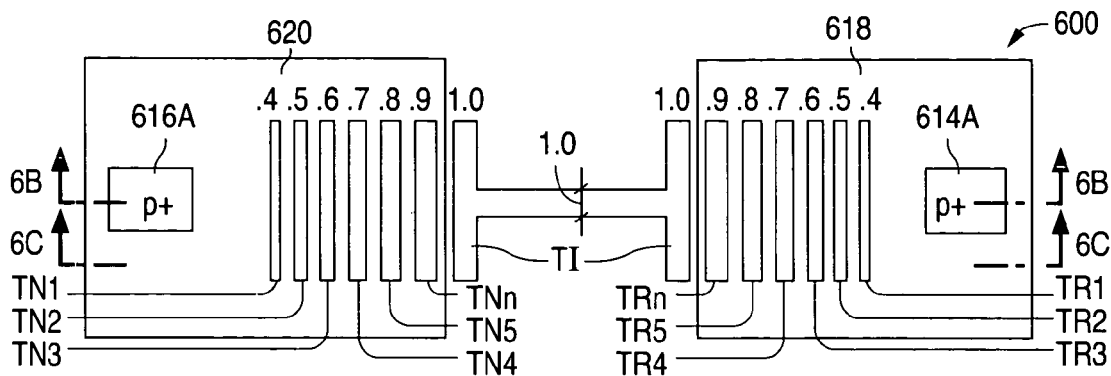
FIGS. 6A–6C are cross-sectional views illustrating an example of a conductive structure 600 in accordance with the present invention.
Figure 6B:
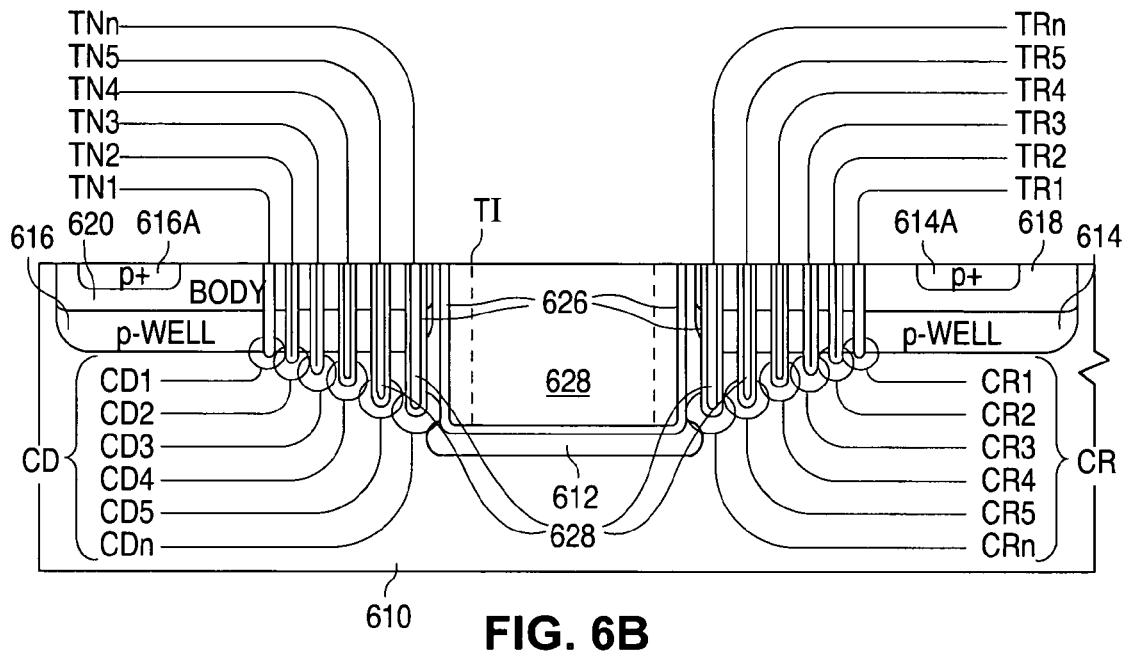
Figure 6C:
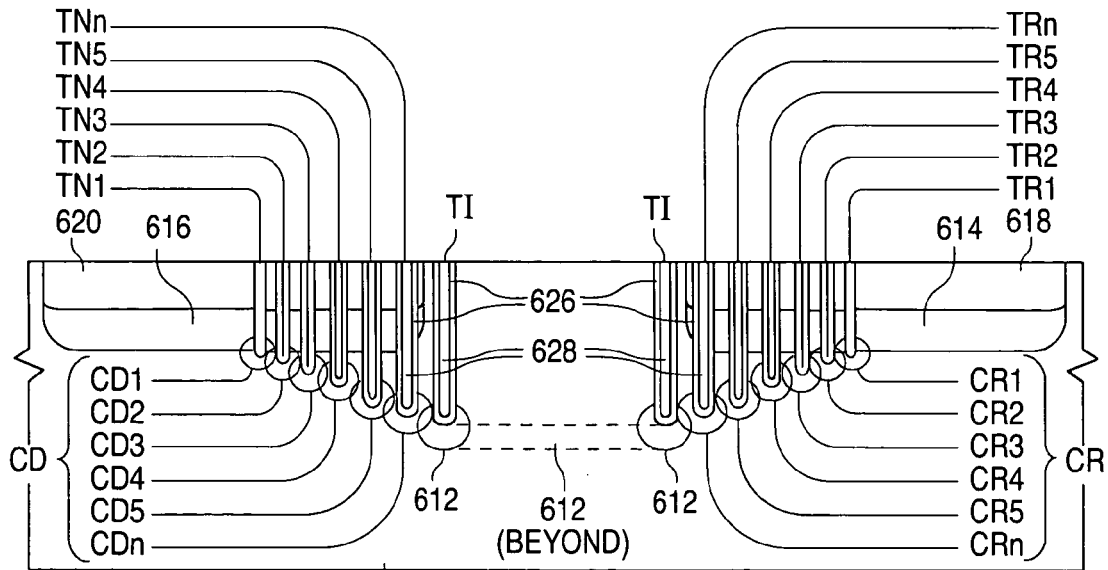

FIGS. 6A–6C show a series of views that illustrate an example of a conductive structure 600 in accordance with the present invention. FIG. 6A is a plan view, while FIGS. 6B and 6C are cross-sectional views taken along lines 6B—6B and 6C—6C, respectively, of FIG. 6A. As shown in FIGS. 6A–6C, conductive structure 600, which is formed in a semiconductor material 610, such as an epitaxial layer on an n-type substrate, includes first, second, and third p-type conductive regions 612, 614, and 616, respectively, that are formed in material 610. Conductive region 612 is vertically spaced apart from conductive regions 614 and 616.

In the FIGS. 6A–6C example, first conductive region 612 is formed as an "H" shaped, p-type subsurface region in an n-type portion of semiconductor material 610, while second and third conductive regions 614 and 616 are formed as p-type wells that contact the top surface of semiconductor material 610. First conductive region 612 can be implemented as, for example, a channel stop region.

As further shown in FIGS. 6A–6C, structure 600 can also include a contact region 614A that is formed in second conductive region 614, and a contact region 616A that is formed in second conductive region 616. Contact region 614A has a higher dopant concentration than region 614, and contact region 616A has a higher dopant concentration than region 616. For example, regions 614 and 616 can have p dopant concentrations, while contact regions 614A and 616A can have p+ dopant concentrations.

In addition, structure 600 can optionally include a p-body region 618 that is formed in well 614, and a p-body region 620 that is formed in well 616. Regions 618 and 620 have a slightly higher dopant concentrations than wells 614 and 616, respectively. Further, p-body regions 618 and 620 are approximately the same size and shape in plan view as wells 614 and 616, respectively.

As further shown in FIGS. 6A–6C, structure 600 also includes an "H" shaped isolation trench TI, a series of spaced apart trenches TR1–TRn, and a series of spaced apart trenches TN1–TNn that are formed in semiconductor material 610. The isolation trench TI is formed over and contacts first conductive region 612. The vertical sections of the "H" shape are formed parallel to the deepest trenches TRn and TNn.

The series of spaced apart trenches TR1–TRn are formed such that the bottom surfaces of trenches TR1–TRn lie between first and second conductive regions 612 and 614. In addition, the widths and depths of the trenches TR1–TRn increase as the bottom surfaces of the trenches move from region 614 to region 612.

The series of spaced apart trenches TN1–TNn are formed in semiconductor material 610 such that the bottom surfaces of trenches TN1–TNn lie between first and third conductive regions 612 and 616. In addition, the widths and depths of the trenches TN1–TNn increase as the bottom surfaces of the trenches move from region 616 to region 612. Further, the trenches TI, TR1–TRn, and TN1–TNn are lined with an isolation material 626, such as an oxide, and are filled with a filler material 628, such as polysilicon or oxide.

Conductive structure 600 additionally includes a p-type conductor CR that electrically connects first and second regions 612 and 614, and a p-type conductor CD that electrically connects first and third regions 612 and 616. Conductor CR includes a series of adjoining p-type conductive regions CR1–CRn that are formed in semiconductor material 610 below and in contact with the bottom surfaces of the trenches TR1–TRn. In the FIG. 6 example, six conductive regions are utilized, with the first conductive region CR1 contacting conductive region 614, and the last conductive region CRn contacting a vertical section of the H-shaped conductive region 612.

Conductor CD, in turn, includes a series of adjoining p-type conductive regions CD1–CDn that are formed in semiconductor material 610 below and in contact with the bottom surfaces of the trenches TN1–TNn. In the FIGS. 6A–6C example, six conductive regions are utilized, with the first conductive region CD1 contacting conductive region 616, and the last conductive region CDn contacting a vertical section of the H-shaped conductive region 612.

In operation, in the FIGS. 6A–6C example, when a first potential is present on contact region 616A and a higher second potential is present on contact region 614A, a current flows from region 614A to region 614, and then to region 612 via conductor CR. The current continues from region 612 to region 616 via conductor CD, and then to region 616A.

Conductive structure 600 can be used, for example, as a buried resistor or a test structure for measuring the performance of a channel stop implant. When used as a test structure, the trenches, including the "H" shaped trench TI, are formed at the same time that the trench isolation regions are formed. In addition, the implant that is used to form the "H" shaped conductive region 612 is formed at the same time that the channel stop implants are formed in the trench isolation regions.

Thus, the horizontal portion of conductive region 612 (which lies below the horizontal bar of the "H" shaped trench TI) can serve as a representative sample of the channel stop implants used with the trench isolation regions, and can be tested to monitor the effective doping of the channel stop implants.

As a result, when a positive voltage is applied to contact region 614A, and contact region 616A is connected to ground, current flows through the structure, allowing measurement of the resistivity of the horizontal portion of conductive region 612. The resistivity measurement provides data on the quality of the channel stop implants without having to physically break and stain the wafer to observe the channel stop implanted regions.

Figure 7A:
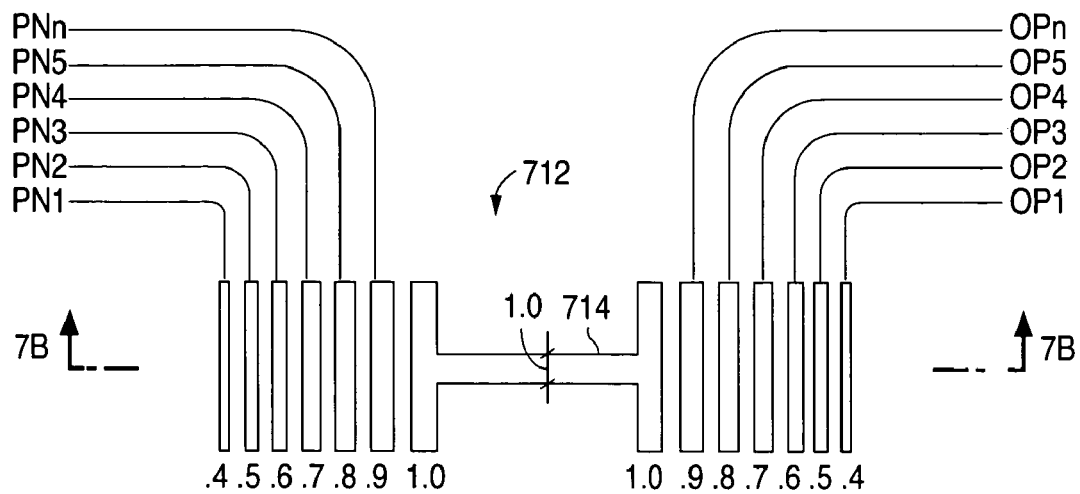
FIGS. 7A–7F are cross-sectional views illustrating an example of a method of forming a conductive structure in accordance with the present invention.
Figure 7B:
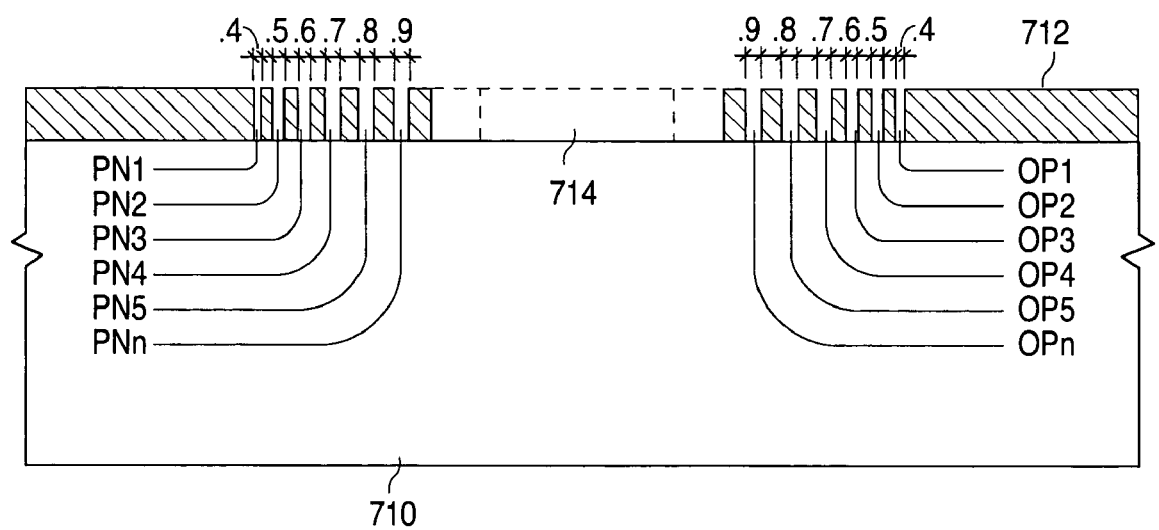

FIGS. 7A–7F show views that illustrate an example of a method of forming a conductive structure in accordance with the present invention. FIG. 7A shows a plan view, while FIGS. 7B–7F show cross-sectional views taken along line 7B—7B of FIG. 7A. As shown in FIGS. 7A–7B, the method, which uses a semiconductor material 710, begins by forming a mask 712 on material 710.

Mask 712 is patterned to have an "H" shaped opening 714, a series of spaced apart first openings OP1–OPn that are parallel to a first vertical leg of the "H", and a series of spaced apart second openings PN1–PNn that are parallel to a second vertical leg of the "H". Each of the openings, in turn, exposes a region of the surface of material 710.

The first and second openings in mask 712 are formed to have different widths. In one embodiment, the first opening OP1 has the smallest width, the last opening OPn has the largest width, while the remaining widths incrementally increase from the smallest to the largest. Similarly, the first opening PN1 has the smallest width, the last opening PNn has the largest width, while the remaining widths incrementally increase from the smallest to the largest. Mask 712 is part of the same mask that is used to form the trenches of the trench isolation regions that are formed on other portions of the wafer.

Figure 7C:
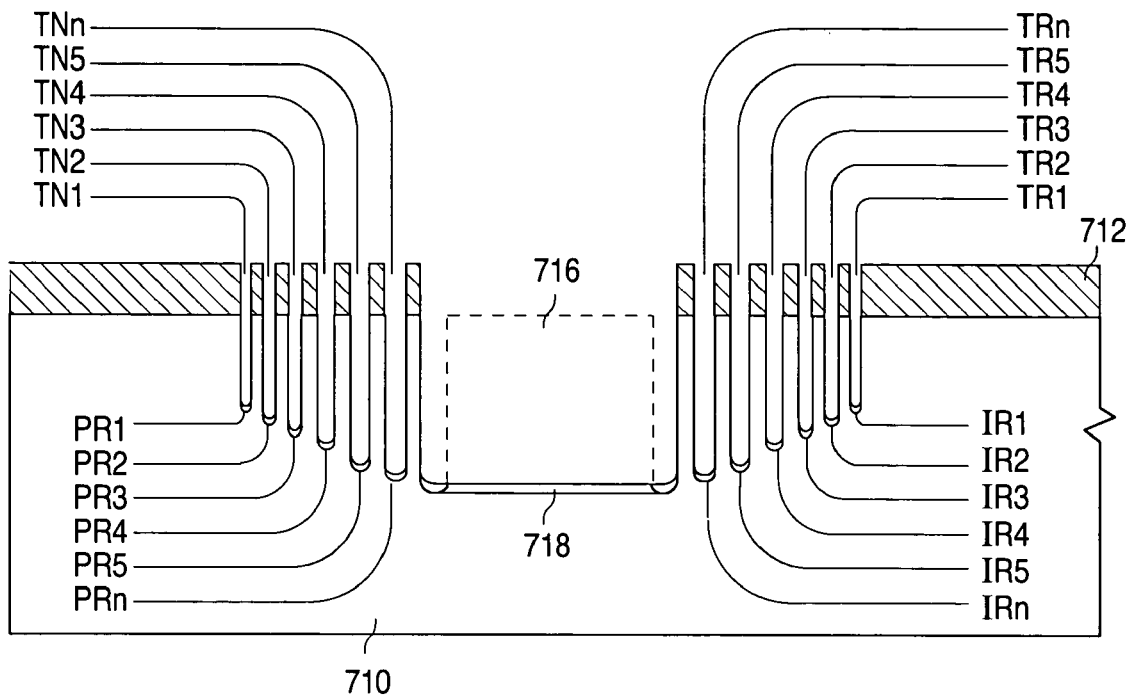

Next, as shown in FIG. 7C, semiconductor material 710 is anisotropically etched to remove the material not protected by mask 712. The etch forms an "H" shaped trench 716, a series of spaced apart first trenches TR1–TRn that are parallel to a first vertical leg of the "H", and a series of spaced apart second trenches TN1–TNn that are parallel to a second vertical leg of the "H". Since the widths of the trenches TR1–TRn and TN1–TNn are different, the depths of the trenches TR1–TRn and TN1–TNn are different due to aspect ratio dependent etching.

As further shown, after the trenches have been formed, the bottom surfaces of trench 716, trenches TR1–TRn, and trenches TN1–TNn are implanted with a p-type dopant, such as boron. The implant forms an "H" shaped implanted region 718 that lies below and contacts the bottom surface of trench 716, a series of implanted regions IR1–IRn that lie below and contact the bottom surfaces of the trenches TR1–TRn, and a series of implanted regions PR1–PRn that lie below and contact the bottom surfaces of trenches TN1–TNn. Following this, mask 712 is removed. Trench 716, trenches TR1–TRn, and trenches TN1–TNn can be implanted at the same time that the channel stop is implanted below the trenches of the trench isolation regions that are formed on other portions of the wafer.

Figure 7D:
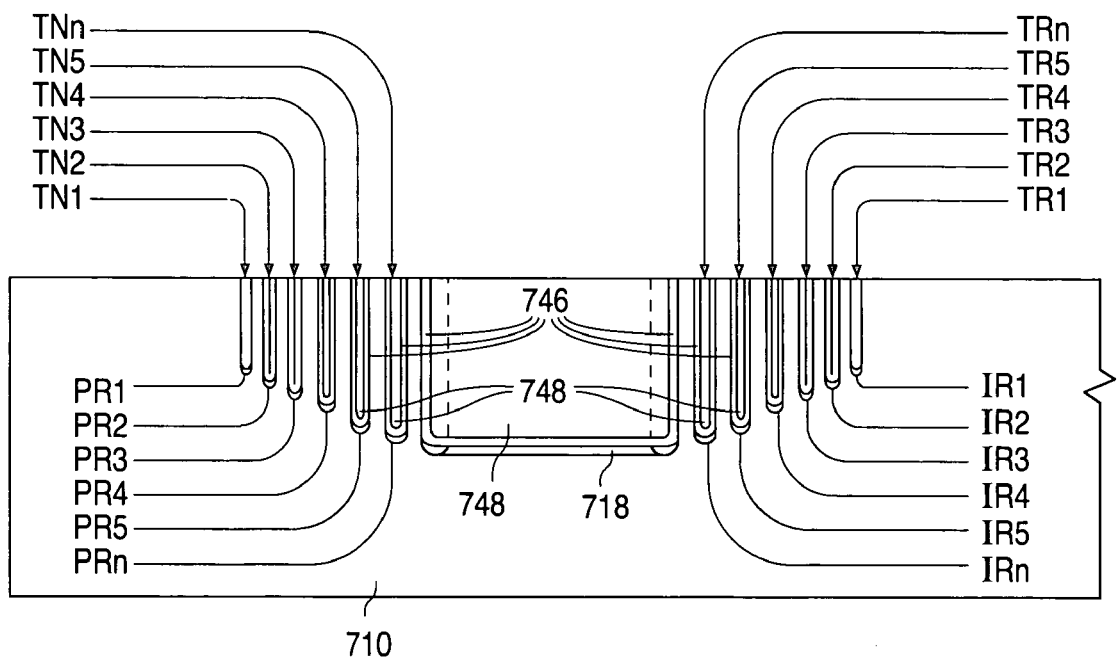

Turning to FIG. 7D, after mask 712 has been removed, a layer of isolation material 746, such as thermally grown oxide, is formed on semiconductor material 710, trench 716, trenches TR1–TRn, and trenches TN1–TNn to line the trenches. After trench 716, trenches TR1–TRn, and trenches TN1–TNn have been lined, a layer of filler material 748, such as oxide or polysilicon, is formed on material 746 to fill trench 716, trenches TR1–TRn, and trenches TN1–TNn. Once filled, the top surface of semiconductor material 710 is planarized to remove filler material 748 and isolation material 746 from the top surface of semiconductor material 710.

Figure 7E:
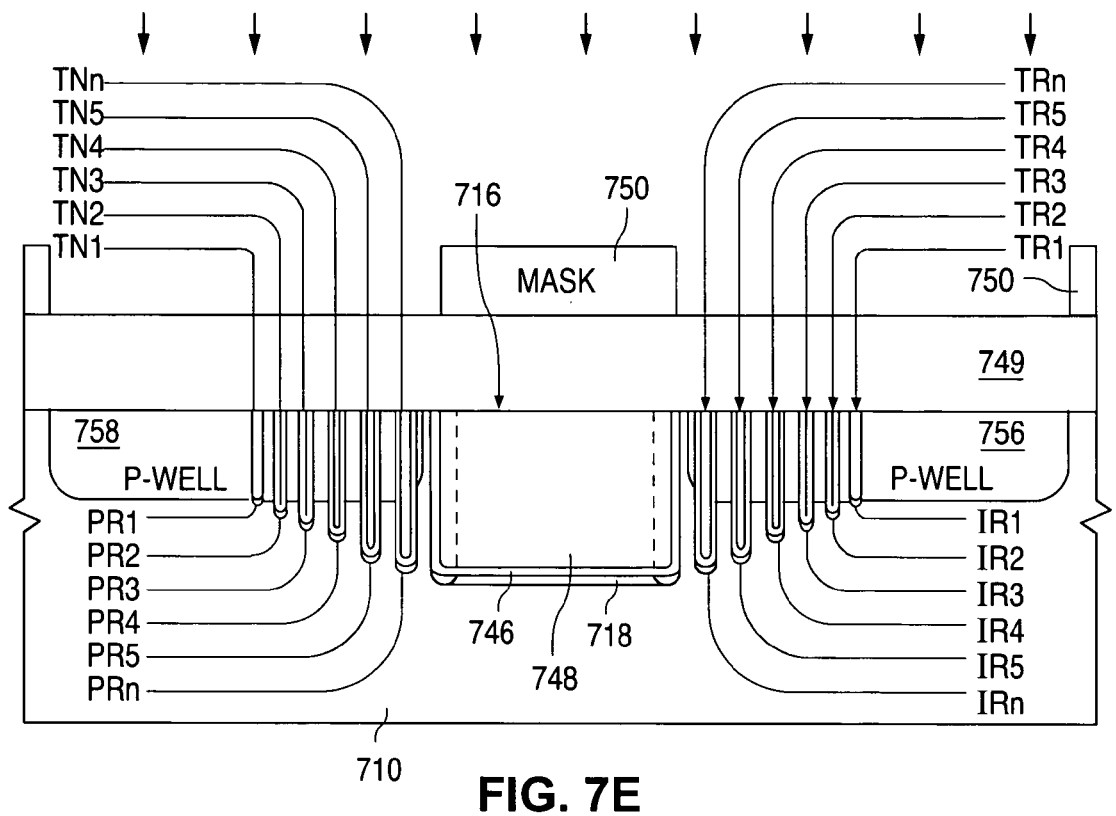

The next step, as shown in FIG. 7E, is to form an insulating layer 749, such as sacrificial oxide, on semiconductor material 710 and the top surfaces of the isolation material 746 and fill material 748 in trench 716, trenches TR1–TRn, and trenches TN1–TNn. Following this, a mask 750 is formed and patterned on layer 749. Mask 750 is used to protect n-type regions and center trench 716.

Semiconductor material 710 is then implanted with a p-type dopant to form p-type well 756 adjacent to trench TR1 and a p-type well 758 adjacent to trench TN1. Wells 756 and 758 can be formed at the same time that the p-wells are formed on other portions of the wafer. Mask 750 and sacrificial layer 749 are then removed.

Figure 7F:
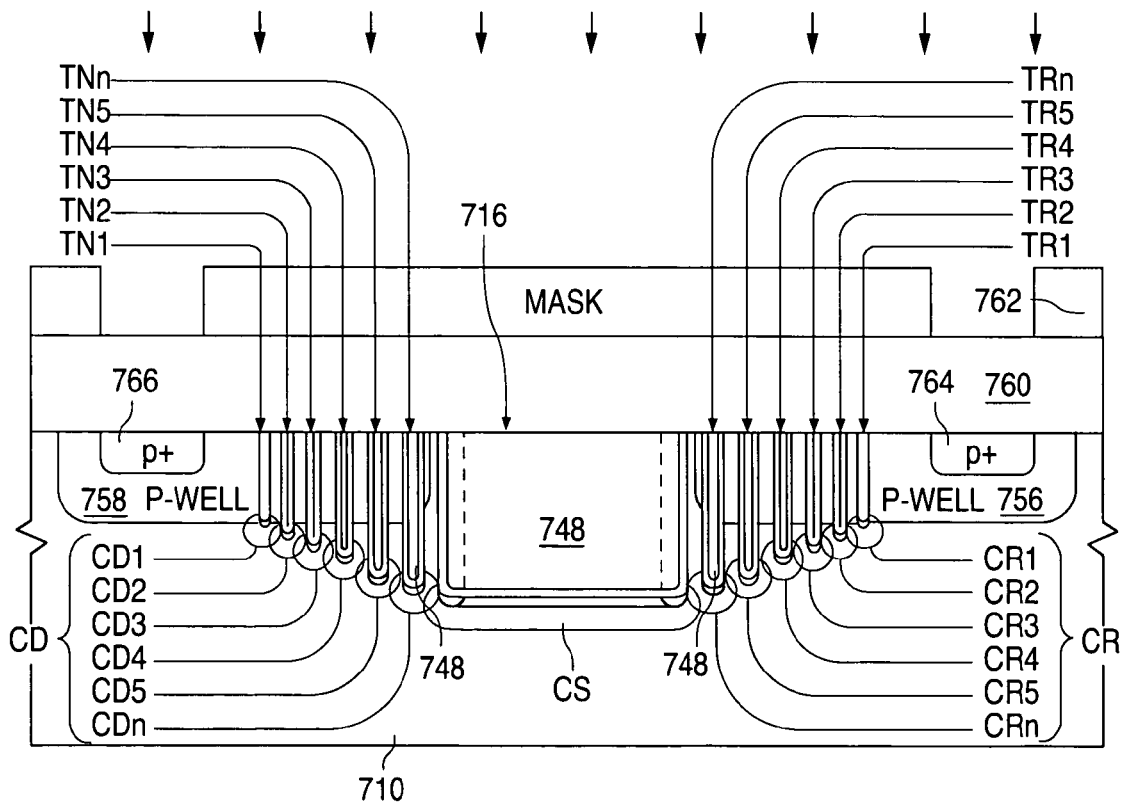

After this, as shown in FIG. 7F, an insulating layer 760, such as oxide, is formed on semiconductor material 710 and the top surfaces of the isolation material 746 and fill material 748 in trench 716, trenches TR1–TRn, and trenches TN1–TNn. Following this, a mask 762 is formed and patterned on layer 760. (A number of intermediate steps typically take place on other portions of the wafer to form MOS and/or bipolar transistors prior to the formation of mask 762. Mask 762 is used to protect the n-type regions and expose the p-type contact regions of the wafer.)

Following this, the wafer is implanted with a p-type dopant to form p+ region 764 in well 756 and a p+ region 766 in well 758. After the implant, the wafer is annealed to drive in the dopants and repair lattice damage caused by the implants.

The annealing process causes the dopants in the implanted regions IR1–IRn and PR1–PRn below the bottom surfaces of trenches TR1–TRn and TN1–TNn, respectively, to diffuse in the surrounding semiconductor material to form conductive regions CR1–CRn around implanted regions IR1–IRn, and conductive regions CD1–CDn around implanted regions PR1–PRn. In addition, implanted region 718 also diffuses to form a conductive region CS.

Conductive regions CR1–CRn contact each other to form a conductor CR that contacts conductive region CS and well 756. Similarly, conductive regions CD1–CDn contact each other to form a conductor CD that contacts conductive region CS and well 758. After the wafer has been annealed, the method continues with conventional back end processing steps.

Figure 8A:
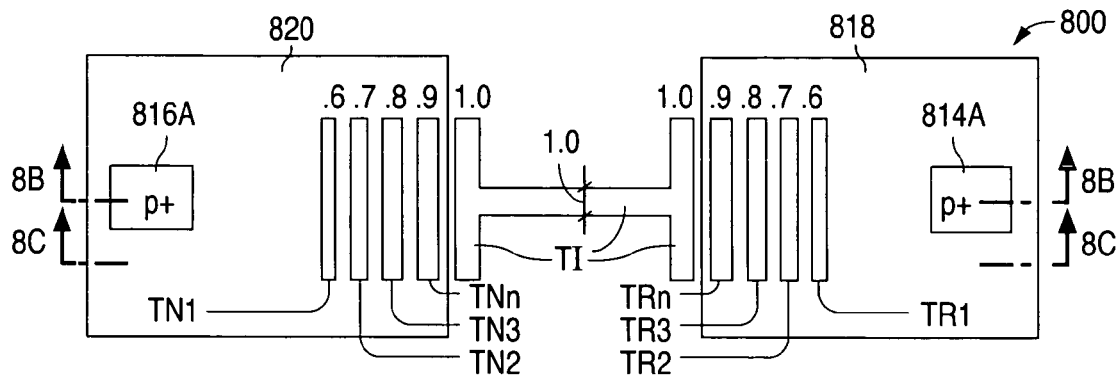
FIGS. 8A–8C are cross-sectional views illustrating an example of a conductive structure 800 in accordance with the present invention.
Figure 8B:
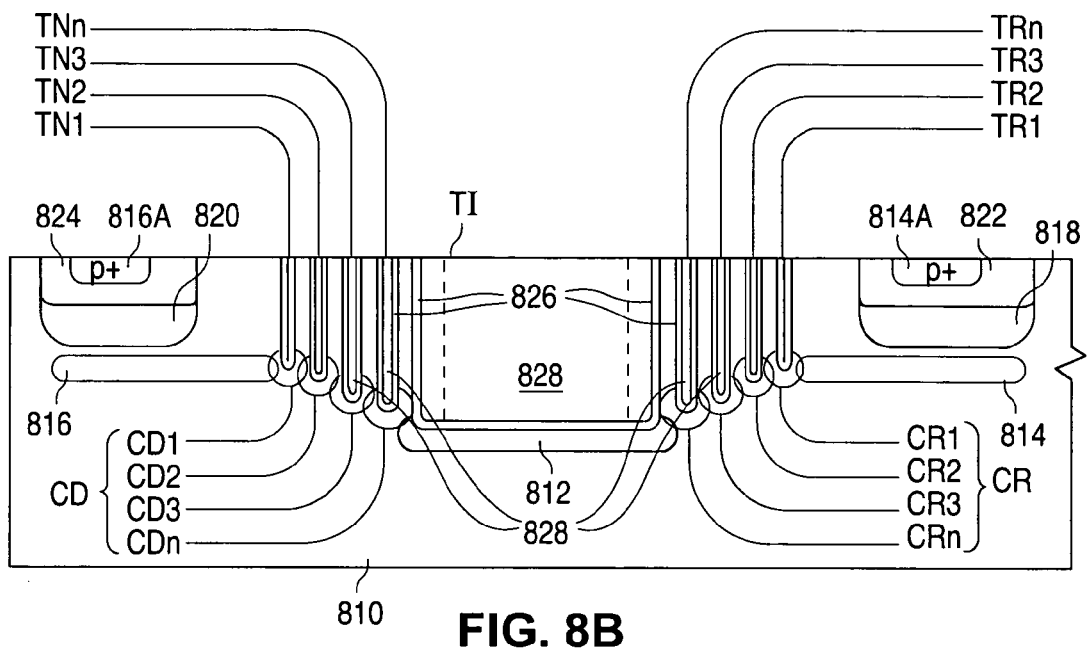
Figure 8C:
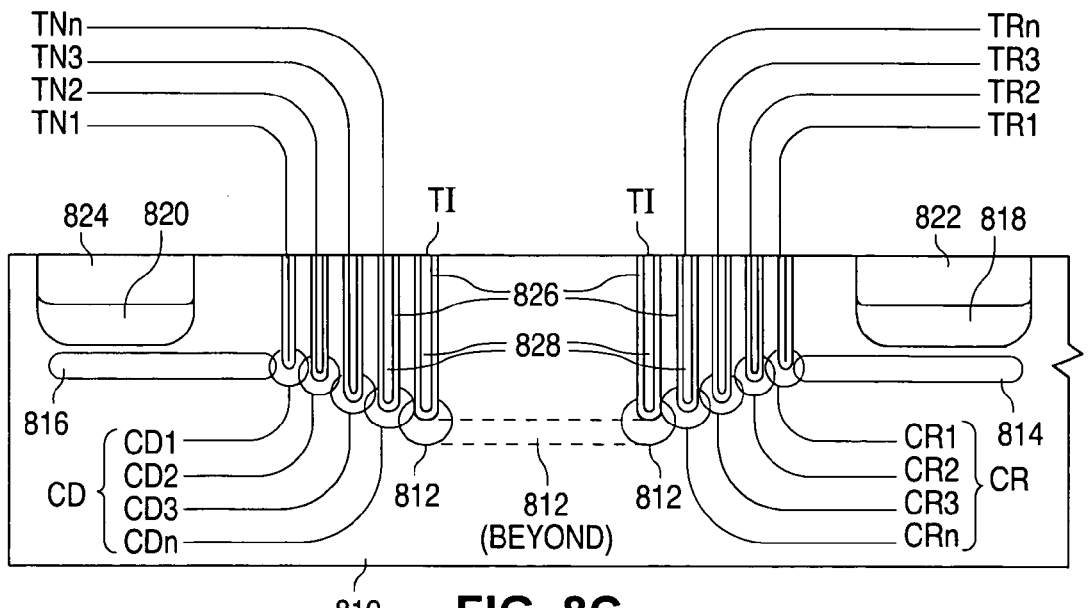

FIGS. 8A–8C show a series of views that illustrate an example of a conductive structure 800 in accordance with the present invention. FIG. 8A is a plan view, while FIGS. 8B and 8C are cross-sectional views taken along lines 8B—8B and 8C—8C, respectively, of FIG. 8A. As shown in FIGS. 8A–8C, conductive structure 800, which is formed in a semiconductor material 810, such as an epitaxial layer on a substrate, includes first, second, and third p-type conductive regions 812, 814, and 816, respectively, that are formed in an n-type portion of material 810. Conductive region 812 is vertically spaced apart from conductive regions 814 and 816.

In the FIGS. 8A–8C example, first conductive region 812 is formed as an "H" shaped, p-type subsurface region in semiconductor material 810, while second and third conductive regions 814 and 816 are also formed as p-type subsurface regions in semiconductor material 810. First conductive region 812 can be implemented as, for example, a channel stop region, while second and third conductive regions 814 and 816 can be implemented as, for example, buried layers.

As further shown in FIGS. 8A–8C, structure 800 also includes a contact region 814A that is formed in material 810, and a contact region 816A that is formed in material 810. Contact region 814A has approximately the same dopant concentration as region 814, and contact region 816A has approximately the same dopant concentration as region 816.

In addition, structure 800 can optionally include a p-well 818 that is formed in material 810 such that region 814A is formed in well 818, and a p-well 820 that is formed in material 810 such that region 816A is formed in well 820. Further, structure 800 can optionally include a p-body region 822 that is formed in well 818, and a p-body region 824 that is formed in well 820. Regions 822 and 824 have a slightly higher dopant concentrations than wells 818 and 820, respectively. Further, p-body regions 822 and 824 are approximately the same size and shape in plan view as wells 818 and 820.

As further shown in FIGS. 8A–8C, structure 800 also includes an "H" shaped isolation trench TI, a series of spaced apart trenches TR1–TRn, and a series of spaced apart trenches TN1–TNn that are formed in semiconductor material 810. The isolation trench TI is formed over and contacts first conductive region 812. The vertical sections of the "H" shape are formed parallel to the deepest trenches TRn and TNn.

The series of spaced apart trenches TR1–TRn are formed such that the bottom surfaces of trenches TR1–TRn lie between first and second conductive regions 812 and 814. In addition, the widths and depths of the trenches TR1–TRn increase as the bottom surfaces of the trenches move from region 814 to region 812.

The series of spaced apart trenches TN1–TNn are formed in semiconductor material 810 such that the bottom surfaces of trenches TN1–TNn lie between first and third conductive regions 812 and 816. In addition, the widths and depths of the trenches TN1–TNn increase as the bottom surfaces of the trenches move from region 816 to region 812. Further, the trenches TI, TR1–TRn, and TN1–TNn are lined with an isolation material 826, such as an oxide, and are filled with a filler material 828, such as polysilicon or oxide.

Conductive structure 800 additionally includes a p-type conductor CR that electrically connects first and second regions 812 and 814, and a p-type conductor CD that electrically connects first and third regions 812 and 816. Conductor CR includes a series of adjoining p-type conductive regions CR1–CRn that are formed in semiconductor material 810 below and in contact with the bottom surfaces of the trenches TR1–TRn. In the FIGS. 8A–8C example, four conductive regions are utilized, with the first conductive region CR1 contacting conductive region 814, and the last conductive region CRn contacting a vertical section of the H-shaped conductive region 812.

Conductor CD, in turn, includes a series of adjoining p-type conductive regions CD1–CDn that are formed in semiconductor material 810 below and in contact with the bottom surfaces of the trenches TN1–TNn. In the FIGS. 8A–8C example, four conductive regions are utilized, with the first conductive region CD1 contacting conductive region 816, and the last conductive region CDn contacting a vertical section of the H-shaped conductive region 812.

In operation, in the FIGS. 8A–8C example, when a first potential is present on contact region 816A and a higher second potential is present on contact region 814A, a current flows from region 814A to region 814 through material 810 (or well 818 and body 822 if present), and then to region 812 via conductor CR. The current continues from region 812 to region 816 via conductor CD, and then to region 816A through material 810 (or well 820 and body 824 if present).

Conductive structure 800 can be used, for example, as a buried resistor or a test structure for measuring the performance of a channel stop implant. When used as a test structure, the trenches, including the "H" shaped trench TI, are formed at the same time that the trench isolation regions are formed. In addition, the implant that is used to form the "H" shaped conductive region 812 is formed at the same time that the channel stop implants are formed in the trench isolation regions.

Thus, the horizontal portion of conductive region 812 (which lies below the horizontal bar of the "H" shaped trench TI) can serve as a representative sample of the channel stop implants used with the trench isolation regions, and can be tested to monitor the effective doping of the channel stop implants.

As a result, when a positive voltage is applied to contact region 814A, and contact region 816A is connected to ground, current flows through the structure, allowing measurement of the resistivity of the horizontal portion of conductive region 812. The resistivity measurement provides data on the quality of the channel stop implants without having to physically break and stain the wafer to observe the channel stop implanted regions.

Figure 9A:
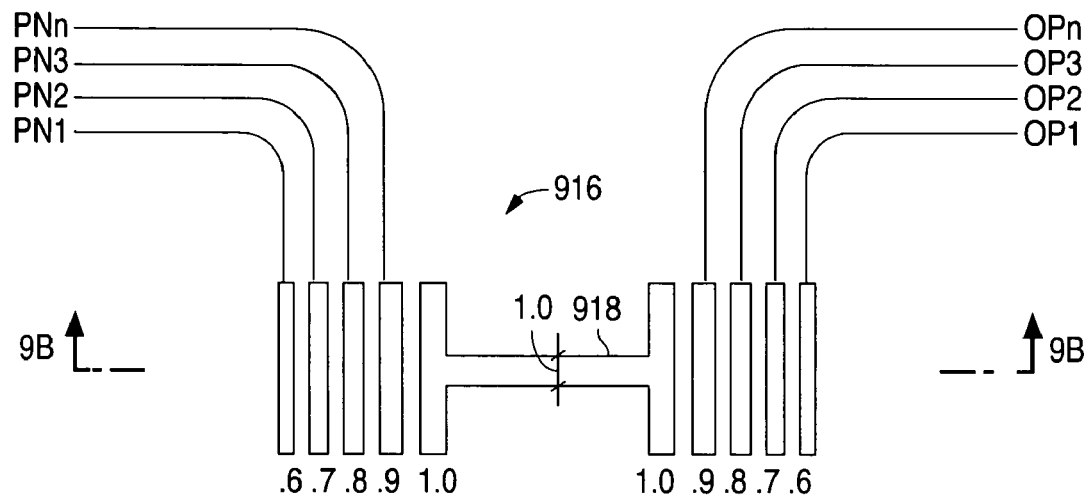
FIGS. 9A–9F are cross-sectional views illustrating an example of a method of forming a conductive structure in accordance with the present invention.

FIGS. 9A–9F show cross-sectional views that illustrate an example of a method of forming a conductive structure in accordance with the present invention. As shown in FIG. 9A, the method uses a conventionally formed semiconductor material 910, such as an epitaxial layer on an n-type substrate, that has spaced-apart p-type subsurface conductive regions 912 and 914, such as buried layers, formed in an n-type region of material 910 between the epitaxial layer and the substrate.

Figure 9B:
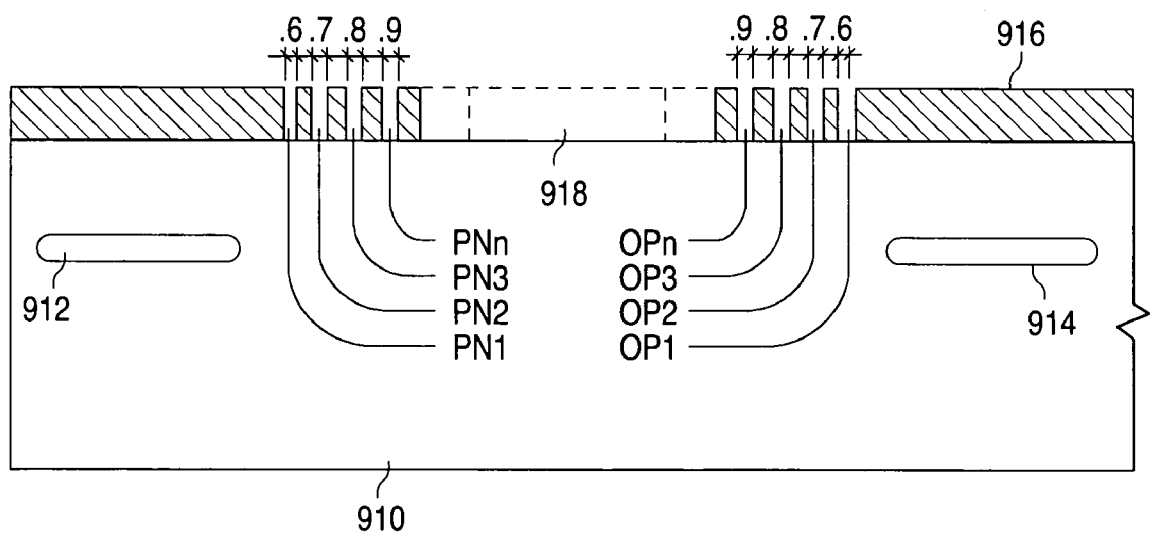

As further shown in FIGS. 9A and 9B, the method begins by forming a mask 916 on semiconductor material 910. Mask 916 is patterned to have an "H" shaped opening 918, a series of spaced apart first openings OP1–OPn that are parallel to a first vertical leg of the "H", and a series of spaced apart second openings PN1–PNn that are parallel to a second vertical leg of the "H". Each of the openings, in turn, exposes a region of the surface of material 910.

The first and second openings in mask 916 are formed to have different widths. In one embodiment, the first opening OP1 has the smallest width, the last opening OPn has the largest width, while the remaining widths incrementally increase from the smallest to the largest. Similarly, the first opening PN1 has the smallest width, the last opening PNn has the largest width, while the remaining widths incrementally increase from the smallest to the largest. Mask 916 is part of the same mask that is used to form the trenches of the trench isolation regions that are formed on other portions of the wafer.

Figure 9C:
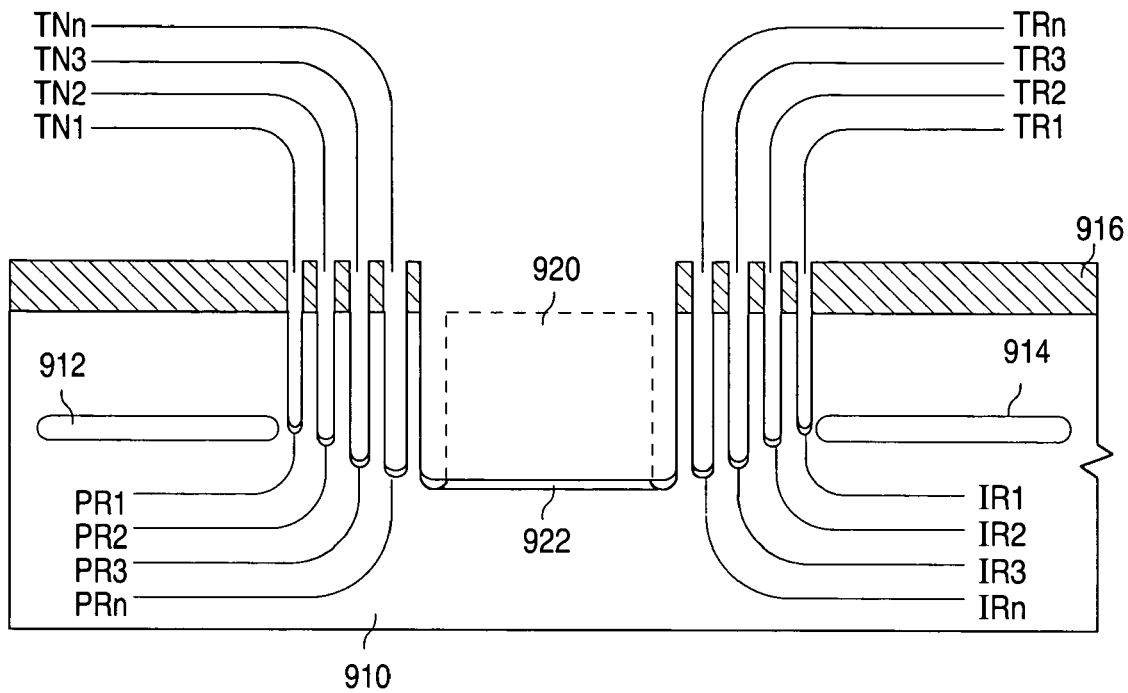

Next, as shown in FIG. 9C, semiconductor material 910 is anisotropically etched to remove the material not protected by mask 916. The etch forms an "H" shaped trench 920, a series of spaced apart first trenches TR1–TRn that are parallel to a first vertical leg of the "H", and a series of spaced apart second trenches TN1–TNn that are parallel to a second vertical leg of the "H". Since the widths of the trenches TR1–TRn and TN1–TNn are different, the depths of the trenches TR1–TRn and TN1–TNn are different due to aspect ratio dependent etching.

As further shown, after the trenches have been formed, the bottom surfaces of trench 920, trenches TR1–TRn, and trenches TN1–TNn are implanted with a p-type dopant, such as boron. The implant forms an "H" shaped implanted region 922 that lies below and contacts the bottom surface of trench 920, a series of implanted regions IR1–IRn that lie below and contact the bottom surfaces of the trenches TR1–TRn, and a series of implanted regions PR1–PRn that lie below and contact the bottom surfaces of trenches TN1–TNn. Following this, mask 916 is removed. Trench 920, trenches TR1–TRn, and trenches TN1–TNn can be implanted at the same time that the channel stop is implanted below the trenches of the trench isolation regions that are formed on other portions of the wafer.

Figure 9D:
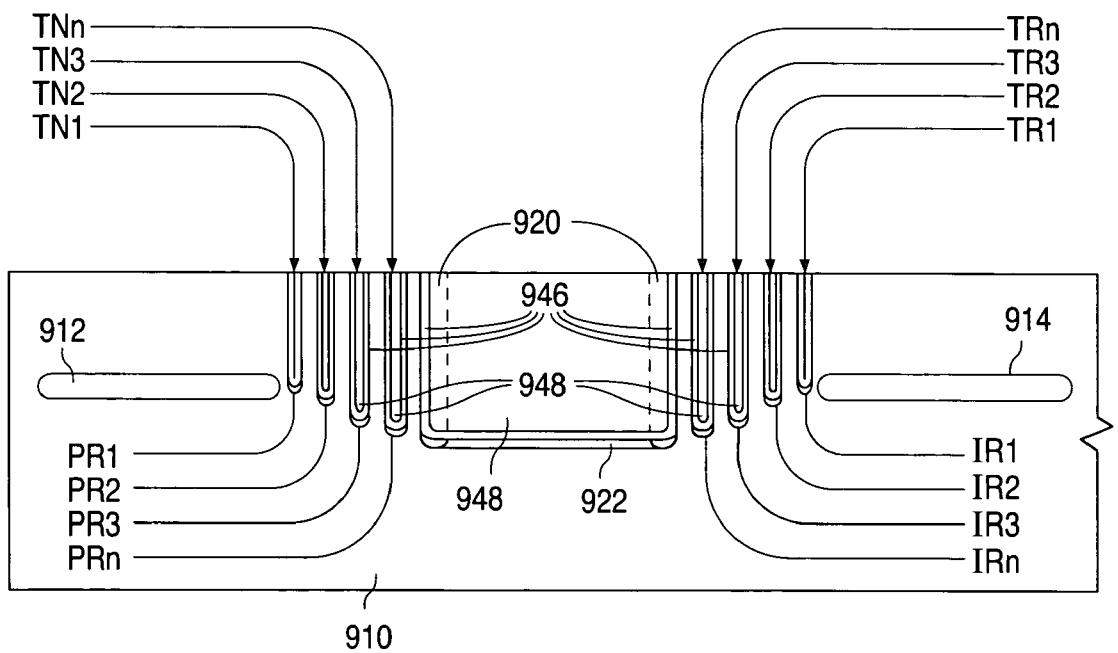

Turning to FIG. 9D, after mask 916 has been removed, a layer of isolation material 946, such as thermally grown oxide, is formed on semiconductor material 910, trench 920, trenches TR1–TRn, and trenches TN1–TNn to line the trenches. After trench 920, trenches TR1–TRn, and trenches TN1–TNn have been lined, a layer of filler material 948, such as oxide or polysilicon, is formed on material 946 to fill trench 920, trenches TR1–TRn, and trenches TN1–TNn. Once filled, the top surface of semiconductor material 910 is planarized to remove filler material 948 and isolation material 946 from the top surface of semiconductor material 910.

Figure 9E:
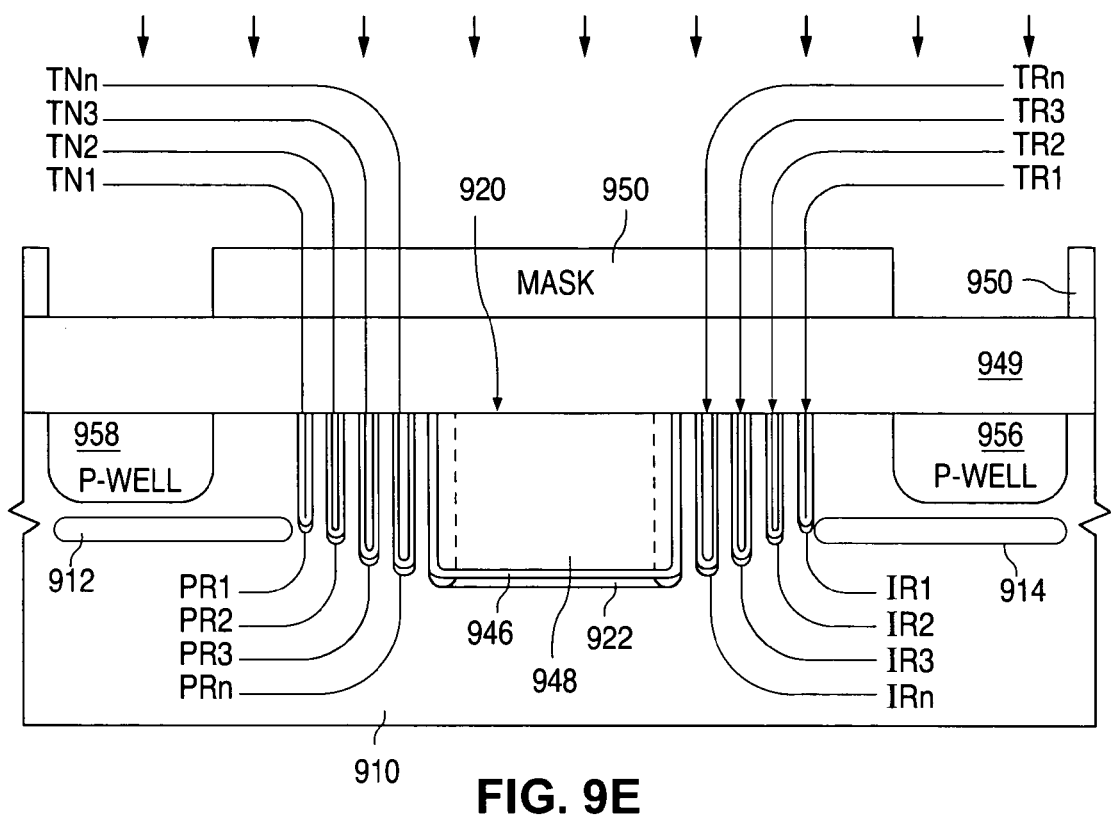

The next step, as shown in FIG. 9E, is to form an insulating layer 949, such as sacrificial oxide, on semiconductor material 910 and the top surfaces of the isolation material 946 and fill material 948 in trench 920, trenches TR1–TRn, and trenches TN1–TNn. Following this, a mask 950 is formed and patterned on layer 949. Mask 950 is used to protect n-type regions and center trench 920.

Semiconductor material 910 is then implanted with a p-type dopant to form a p-type well 956 over and spaced apart from conductive region 914 and a p-type well 958 over and spaced apart from conductive region 912. Wells 956 and 958 can be formed at the same time that the p-wells are formed on other portions of the wafer. Mask 950 and sacrificial layer 949 are then removed.

Figure 9F:
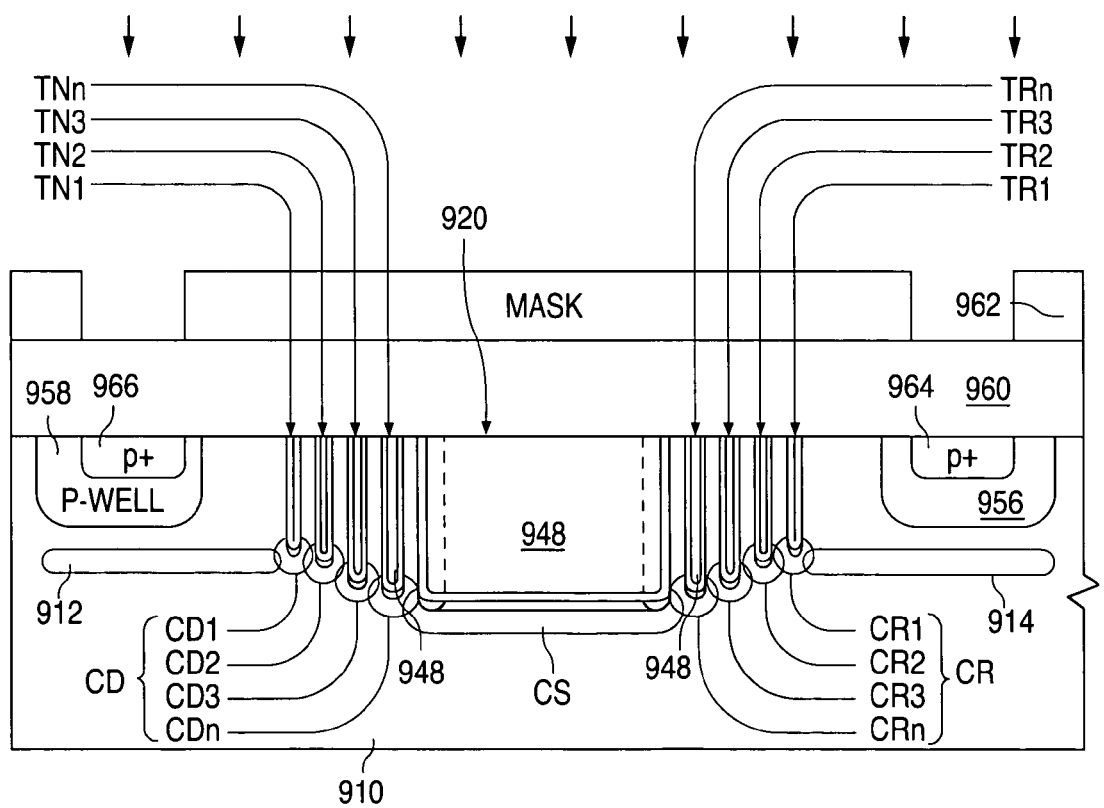

After this, as shown in FIG. 9F, an insulating layer 960, such as oxide, is formed on semiconductor material 910 and the top surfaces of the isolation material 946 and fill material 948 in trench 920, trenches TR1–TRn, and trenches TN1–TNn. Following this, a mask 962 is formed and patterned on layer 960. (A number of intermediate steps typically take place on other portions of the wafer to form MOS and/or bipolar transistors prior to the formation of mask 962. Mask 962 is used to protect the n-type regions and expose the p-type contact regions of the wafer.)

Following this, the wafer is implanted with a p-type dopant to form p+ region 964 in well 956 and a p+ region 966 in well 958. After the implant, the wafer is annealed to drive in the dopants and repair lattice damage caused by the implants.

The annealing process causes the dopants in the implanted regions IR1–IRn and PR1–PRn below the bottom surfaces of trenches TR1–TRn and TN1–TNn, respectively, to diffuse in the surrounding semiconductor material to form conductive regions CR1–CRn around implanted regions IR1–IRn, and conductive regions CD1–CDn around implanted regions PR1–PRn. In addition, implanted region 922 also diffuses to form a channel stop region CS.

Conductive regions CR1–CRn contact each other to form a conductor CR that contacts channel stop region CS and conductive region 914. Similarly, conductive regions CD1–CDn contact each other to form a conductor CD that contacts channel stop region CS and conductive region 912. After the wafer has been annealed, the method continues with conventional back end processing steps.

Figure 10A:
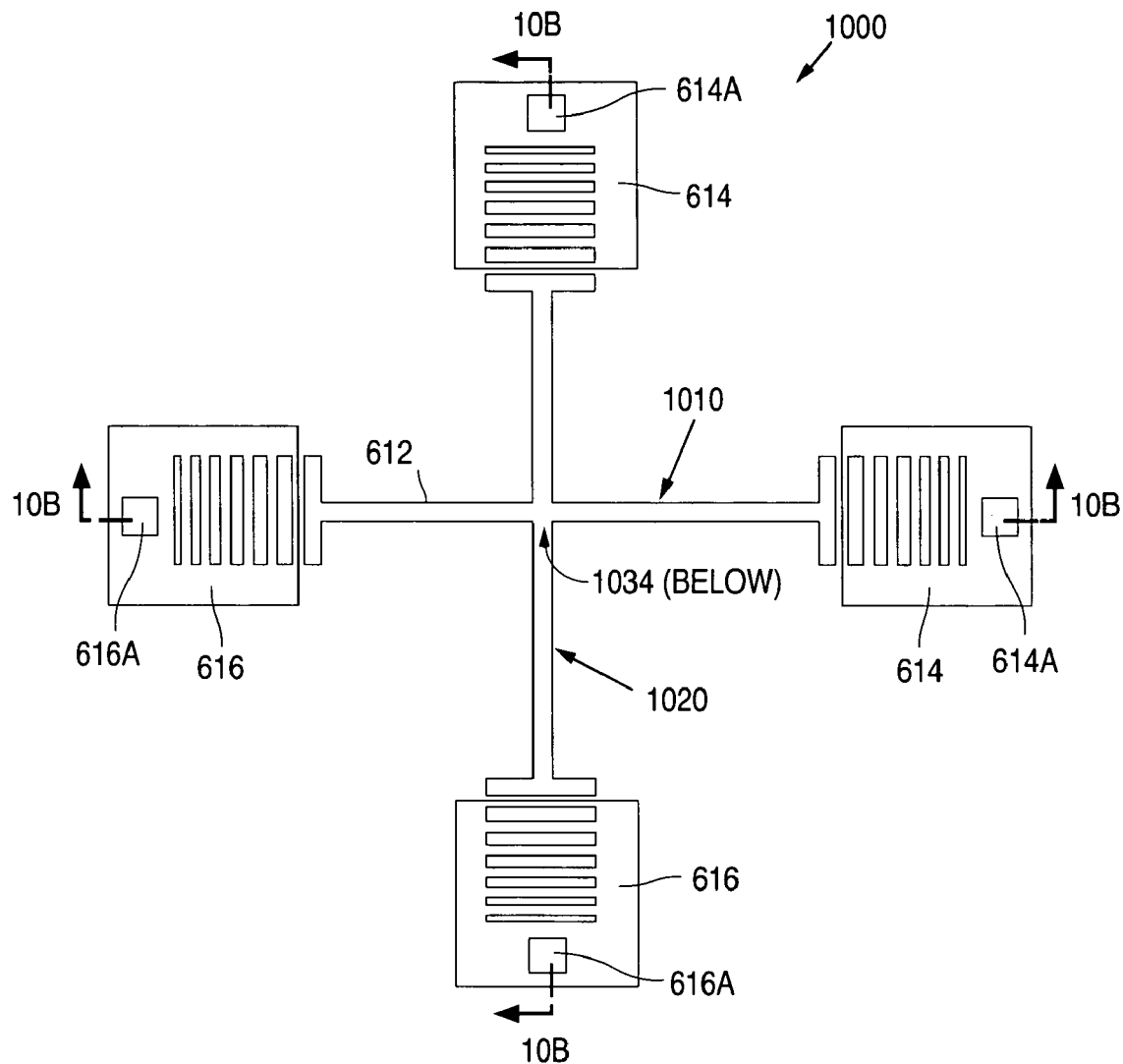
FIGS. 10A and 10B are views illustrating an example of a conductive structure 1000 in accordance with the present invention.
Figure 10B:
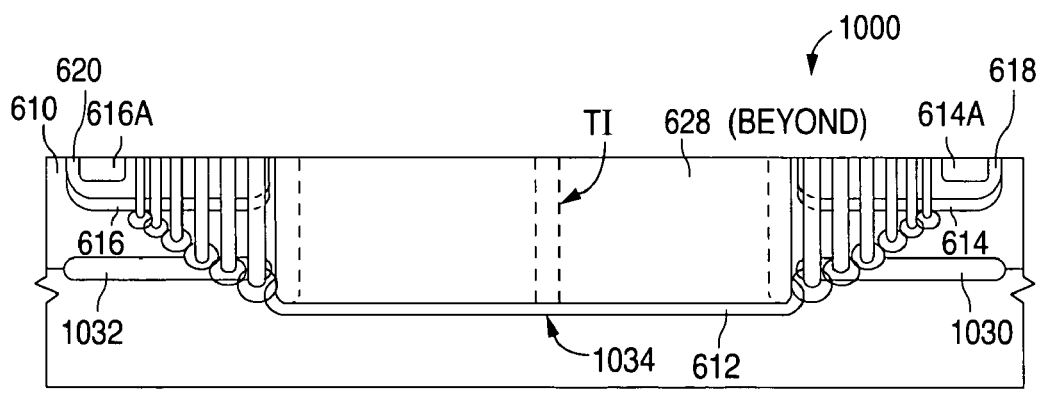

FIGS. 10A and 10B show views that illustrate an example of a conductive structure 1000 in accordance with the present invention. FIG. 10A is a plan view, while FIG. 10B is a cross-sectional view taken along line 10B—10B of FIG. 10A. Structure 1000 can be used as a Van der Pauw device to test the electrical resistivity of a dopant implant.

As shown in FIG. 10A, conductive structure 1000 includes a first structure 1010 and a second structure 1020 which are the same as conductive structure 600. (Structures 1010 and 1020 can alternately be the same as structure 800.) Conductive structure 1000 is formed so that the center bar of the H shaped trench in structure 1010 intersects the center bar of the H shaped trench in structure 1020, to form a symmetrical, cross-shaped structure in plan view.

Conductive structures 1010 and 1020 can also include buried regions 1030 and 1032 as shown in FIG. 10B. The configuration of structure 1000 allows the Van der Pauw method to be used to test the resistivity of an implanted region 1034 that is located in the semiconductor material below the area where the H shaped trenches intersect.

In operation, the contact regions in structures 1010 and 1020 can be connected to a supply voltage or ground to measure the resistivity of implanted region 1034. By using the Van der Pauw test method in conjunction with structure 1000, the performance of the trench isolation regions used on other regions of the wafer can be monitored.

As described for conductive structure 600, one advantage of conductive structure 1000 is that the present invention provides a method to assess the quality of a dopant implant without having to physically break the wafer and observe the implanted region.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a conductive structure in a semiconductor material, the semiconductor material having a top surface, the method comprising:
    forming a plurality of spaced-apart trenches in the semiconductor material, each trench having a bottom surface;
    introducing dopant atoms into the semiconductor material through the bottom surface of each trench;
    forming a conductive region in the semiconductor material, a top surface of the conductive region contacting the top surface of the semiconductor material; and
    diffusing the dopant atoms to form a continuous diffused region that contacts the conductive region and the bottom surface of each trench.

2. The method of claim 1 wherein the semiconductor material has a first conductivity type, and the conductive region and the diffused region have a second conductivity type.

3. The method of claim 2 wherein the semiconductor material includes a subsurface region of the second conductivity type, a top surface of the subsurface region lying below the top surface of the semiconductor material, the diffused region contacting the subsurface region.

4. A method of forming a conductive structure in a semiconductor material of a wafer, the semiconductor material having a top surface, the method comprising:
    forming a number of spaced-apart trenches in the semiconductor material, the trenches including a plurality of first trenches, a plurality of second trenches, a first center trench formed between the first and second trenches, a plurality of third trenches, a plurality of fourth trenches, and a second center trench formed between the third and fourth trenches, the first center trench crossing the second center trench, each trench having a plurality of sidewalls and a bottom surface, a depth of a first trench being different from a depth of an adjacent first trench, a depth of a second trench being different from a depth of an adjacent second trench, a depth of a third trench being different from a depth of an adjacent third trench, a depth of a fourth trench being different from a depth of an adjacent fourth trench;
    implanting dopant atoms into the bottom surface of each trench;
    forming an isolation material on the sidewalls and bottom surface of a trench;
    forming a plurality of conductive regions in the semiconductor material, the plurality of conductive regions including:
        a first conductive region adjacent to the bottom surface of the shallowest first trench of the plurality of first trenches;
        a second conductive region adjacent to the bottom surface of the shallowest second trench of the plurality of second trenches;
        a third conductive region adjacent to the bottom surface of the shallowest third trench of the plurality of third trenches; and
        a fourth conductive region adjacent to the bottom surface of the shallowest fourth trench of the plurality of fourth trenches.

5. The method of claim 4 and further comprising annealing the wafer to cause the dopant atoms at the bottom surface of a first trench to diffuse and contact the dopant atoms at the bottom surface of an adjacent first trench, the dopant atoms at the bottom surface of a second trench to diffuse and contact the dopant atoms at the bottom surface of an adjacent second trench, the dopant atoms at the bottom surface of a third trench to diffuse and contact the dopant atoms at the bottom surface of an adjacent third trench, and the dopant atoms at the bottom surface of a fourth trench to diffuse and contact the dopant atoms at the bottom surface of an adjacent fourth trench.

6. A method of forming a conductive structure in a semiconductor material, the semiconductor material having a top surface, the method comprising:
    forming three or more spaced-apart trenches in the semiconductor material, the three or more trenches including a first trench that has a first depth, a second trench that has a second depth, and a third trench that has a third depth, the second trench lying between the first and third trenches, no trenches lying between the first and second trenches, no trenches lying between the second and third trenches, the second depth being greater than the first depth, the third depth being greater than the second depth, each trench having a bottom surface;
    introducing dopant atoms into the semiconductor material through the bottom surface of each trench; and
    diffusing the dopant atoms to form a continuous diffused region that contacts the bottom surface of each trench.

7. The method of claim 6 wherein the semiconductor material has a first conductivity type and the continuous diffused region has a second conductivity type.

8. The method of claim 6 and further comprising forming a first conductive region of the second conductivity type in the semiconductor material, a top surface of the first conductive region contacting the top surface of the semiconductor material, the continuous diffused region contacting the first conductive region.

9. The method of claim 8 and further comprising forming a second conductive region of the second conductivity type in the semiconductor material, a top surface of the second conductive region lying below the top surface of the semiconductor material, the continuous diffused region contacting the second conductive region.

10. The method of claim 6
    further comprising forming a first conductive region of the second conductivity type in the semiconductor material, a top surface of the first conductive region contacting the top surface of the semiconductor material, the first conductive region being spaced apart from the continuous diffused region; and
    wherein the semiconductor material includes a second conductive region of the second conductivity type that lies below and spaced apart from the first conductive region, the continuous diffused region contacting the second conductive region.

11. The method of claim 6 wherein the three or more trenches further includes a fourth trench that has the second depth, and a fifth trench that has the first depth, the fourth trench lying between the third and fifth trenches, no trenches lying between the fourth and fifth trenches.

12. The method of claim 11 and further comprising forming a first conductive region and a second conductive region in the semiconductor material, the first and second conductive regions having top surfaces that contact the top surface of the semiconductor material, the first and second conductive regions having a conductivity type opposite to a conductivity type of the semiconductor material, the continuous diffused region contacting the first and second conductive regions.

13. The method of claim 12 and further comprising forming a first contact region in the first conductive region, the first contact region having a dopant concentration greater than a dopant concentration of the first conductive region, and a second contact region in the second conductive region, the second contact region having a dopant concentration greater than a dopant concentration of the second conductive region.

14. The method of claim 6 wherein each trench has a width and a length substantially greater than the width.

15. The method of claim 14 wherein the trenches are substantially parallel to each other.

* * * * *